United States Patent [19]
Yasuda et al.

[11] Patent Number: 5,260,579
[45] Date of Patent: Nov. 9, 1993

[54] CHARGED PARTICLE BEAM EXPOSURE SYSTEM AND CHARGED PARTICLE BEAM EXPOSURE METHOD

[75] Inventors: Hiroshi Yasuda; Yasushi Takahashi; Kiichi Sakamoto; Akio Yamada; Yoshihisa Oae; Junichi Kai; Shunsuke Fueki; Kenichi Kawashima, all of Kawasaki, Japan

[73] Assignee: Fujitsu Limited, Kawasaki, Japan

[21] Appl. No.: 851,400

[22] Filed: Mar. 13, 1992

[30] Foreign Application Priority Data

Mar. 13, 1991 [JP] Japan .................. 3-48037
Apr. 26, 1991 [JP] Japan .................. 3-97321

[51] Int. Cl.⁵ .......................................... H01J 37/302
[52] U.S. Cl. .................. 250/492.2; 250/348
[58] Field of Search .......... 250/492.2, 492.22, 492.23, 250/398

[56] References Cited

U.S. PATENT DOCUMENTS

| 4,132,898 | 1/1979 | Buelow et al. | 250/492.22 |
| 4,153,843 | 5/1979 | Pease | 250/492.2 |
| 4,477,729 | 10/1984 | Chang et al. | 250/492.22 |
| 4,482,810 | 11/1984 | Cooke | 250/492.22 |
| 4,494,004 | 1/1985 | Mauer, IV et al. | 250/492.22 |
| 4,581,537 | 4/1986 | Guillaume et al. | 250/492.22 |
| 4,625,121 | 11/1986 | Hamaguchi | 250/492.22 |
| 4,724,328 | 2/1988 | Lischke | 250/492.2 |
| 4,816,692 | 3/1989 | Rudert, Jr. | 250/492.22 |

FOREIGN PATENT DOCUMENTS

| 0364929 | 4/1990 | European Pat. Off. . |
| 0404608 | 12/1990 | European Pat. Off. . |
| 81/00930 | 4/1981 | World Int. Prop. O. . |

OTHER PUBLICATIONS

Hattori et al., "0.25 μm Pattern Formation by Variably Shaped EB Exposure System EX-7," *Extended Abstracts of the 19th Conference on Solid State Devices and Materials*, Aug. 1987, Tokyo, Japan, pp. 287-290.

Primary Examiner—Paul M. Dzierzynski
Assistant Examiner—Kiet T. Nguyen
Attorney, Agent, or Firm—Staas & Halsey

[57] ABSTRACT

A charged particle beam exposure system is directed to an exposure process of an electron beam for sequentially scanning an electron beam employing a blanking aperture array including a plurality of blanking apertures. The system facilitates re-focusing for compensation of focus error due to Coulumb effect and makes wiring the blanking aperture array easier. The system further allows exposure without an irradiation gap. The blanking aperture array 6 is formed with a plurality of said blanking apertures 62 arranged in a two-dimensional configuration. A control system 24 controls the blanking aperture array 62 to set the blanking aperture to the ON state where the charged particle beams pass through the blanking aperture and reach the object 19 to be exposed or the OFF state where the charged particle beams cannot reach the object 19 to be exposed. The other control system of the control means performs a control so that a plurality of said charged particle beams that have passed through different blanking apertures of said blanking aperture array overlaps and is irradiated a plurality of times onto the specified position or the peripheral position in the vicinity of the specified position of the object to be exposed to the charged particle beams.

33 Claims, 19 Drawing Sheets

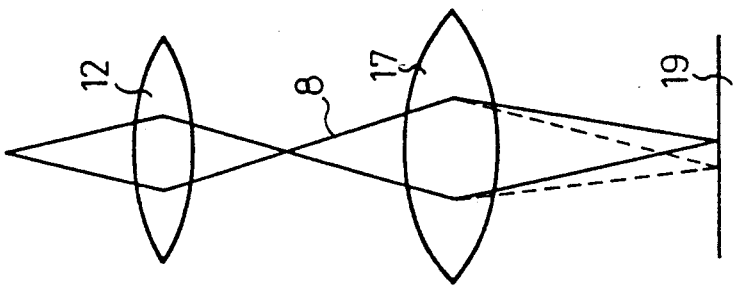
Fig.7(A) NOT REFOCUSED NO. OF ON BEAMS IS SMALL
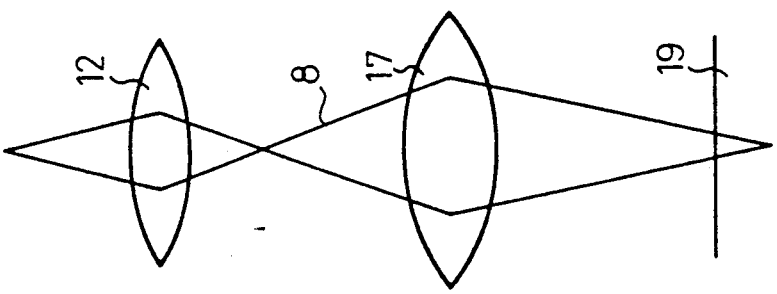
Fig.7(B) NOT REFOCUSED NO. OF ON BEAMS IS LARGE
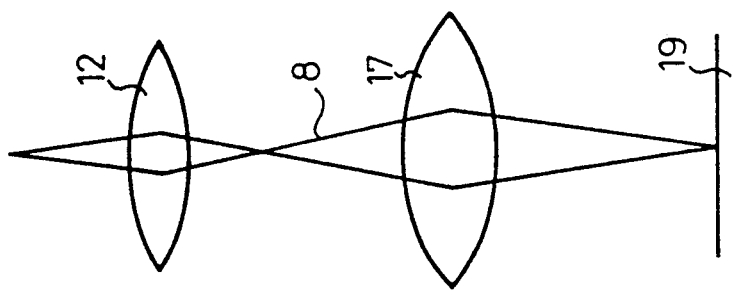
Fig.7(C) REFOCUSED NO. OF ON BEAMS IS LARGE

PATTERN TO BE WRITTEN

SUB FIELD A | SUB FIELD B

WRITING FROM SUB FIELD A

WRITING FROM SUB FIELD B

SLIGHT DEVIATION OF THE WRITING FROM SUB FIELDS

Fig.16(A)
ROUGH CONSTRUCTION OF THE BLANKING APERTURE ARRAY
Fig.16(B)
PATTERN TO BE WRITTEN
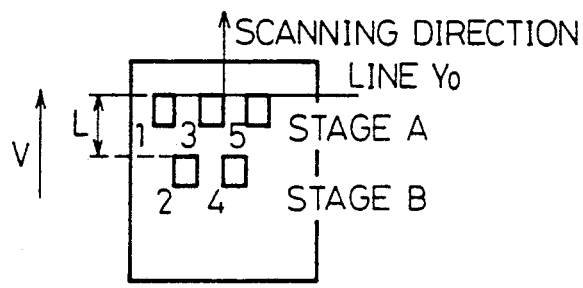
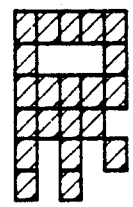
Fig.16(C)
PROGRESS OF THE INADIATED REGION
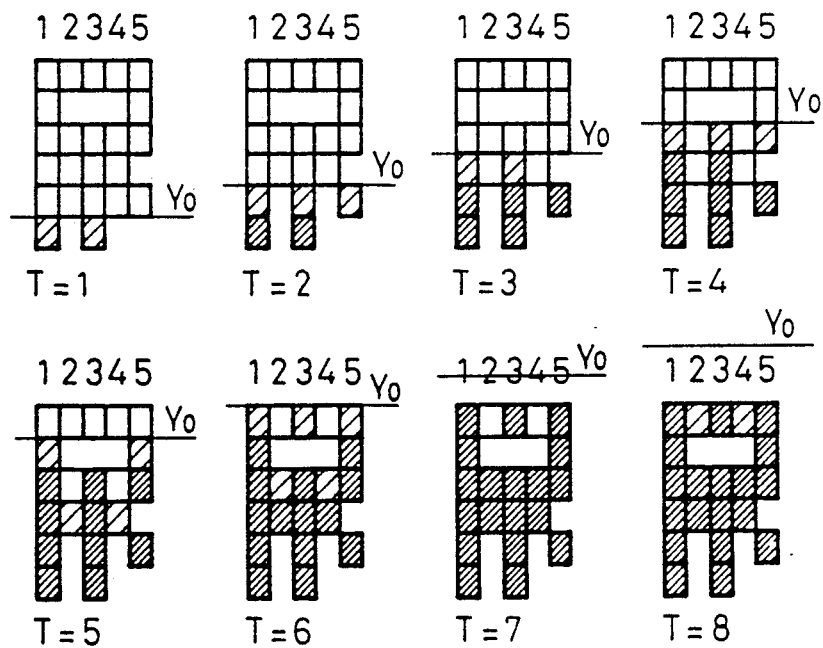

CHARGED PARTICLE BEAM EXPOSURE SYSTEM AND CHARGED PARTICLE BEAM EXPOSURE METHOD

BACKGROUND OF THE INVENTION

1. Field of the Invention

The present invention relates to a charged particle beam exposure system that is adapted to continuously scan a number of charged particle beams with a blanking aperture array having a number of rows of open holes.

2. Description of the Related Art

Lately, because of their increasing importance, ICs have been expected to advance in terms of integration density and function as core technology for technological progress of industrial fields including computers, mechanical control, communications, etc. ICs have reached a four-fold level of high integration within the last three or four years. For example, the integration density of the DRAM has increased from 1M through to 4M, 16M, 64M, 256M and 1G.

Said high integration development has depended solely on the advancement of precision fabrication technology, particularly the advancement of optical technology that allows precision operations in 0.5 $\mu$m units. However, the precision limit of optical technology is approximately 0.3 $\mu$m and it is becoming difficult to maintain a precision of 0.10 $\mu$m in windowing for contact holes and alignment with a pattern of a lower layer. Since a pellicle cannot be applied to a mask in the case of X-ray exposure and a defect-free guarantee is difficult, X-ray exposure cannot be used in the fabrication of LSIs that are required to provide high reliability.

Though, in charged particle beam exposure, precision operations of 0.10 $\mu$m or under can be achieved with alignment accuracy of 0.05 $\mu$m. It has been considered that charged particle beam exposure could not be used for volume production of LSIs because of low throughput. In this case, a one-line configured pattern exposure system has been assumed for precision pattern exposure with at most only one Gaussian beam or variable square beam. The above assumption has been determined in view of the productivity of the existing commercial systems, and not based on the results of checking physical and technological bottlenecks and clarification of causes as to why the said throughput could not be increased or on any consideration as to how the throughput could be increased.

Lately, however, the inventions of a block exposure system and a blanking aperture array system by the inventor of the present invention and others have made it possible to expect a throughput of approximately 1 cm$^2$/sec. This exposure system is so advantageous that other lithographic means cannot compare in terms of precision, alignment accuracy, quick turnaround, reliability and advancement of related software. Thus, the charged particle beam exposure system that enables the manufacturing of nano-lithographic LSIs, such as 1 to 4 GBIT memories, is considered to be a prospective lithography system.

The most popular type of charged particle beam exposure system is the point beam raster scan exposure system. However, in this system, only one beam is used and the throughput is extremely low and therefore the exposure of wafers is impossible at a volume production level.

On the contrary, in the case of the variable square beam system, a limited size of square can be formed by one shot and therefore a satisfactory throughput can be obtained with a rough pattern, the smallest pattern of which is approximately 2 $\mu$m. Accordingly, this system can be used for direct exposure production of small lots of products. However, LSIs of high pattern density cannot overcome the restriction of a one-writing pattern and cannot avoid an extremely low throughput.

As a supplementary system for the above, a system for transferring a repetitive memory pattern as a contraction image of charged particle beams passing through a silicon stencil mask is referred to as the block exposure system. This block exposure system allows volume production of memory chips of 256M and 1G by repeatedly irradiating a pattern, which is used repeatedly for the memory, at a high repetition rate.

However, the block exposure system has the vital defect that the throughput for a random pattern is extremely low, as in case of the variable square beam. Most gate arrays and micro computers are often based on random patterns.

As a method for high speed exposure of such random patterns, a method has been proposed using line beams with the blanking aperture array. FIG. 14 shows an example of a configuration of the prior art blanking aperture array, and this blanking aperture array 6 is provided with a row of openings 62 that are a plural number of apertures arranged in a line. An ON or OFF signal from the beam ON/OFF signal generator 33 is applied independently into the electrodes 61, disposed on the inside surface of the corresponding openings 62, through respective circuit lines $l_1, l_2, \ldots l_n$ and a constant-voltage (for example, a ground potential) is applied to the electrodes 63 provided at the other (i.e., opposite) inside surface of the corresponding openings 62 through a common line (not shown).

Thus, a plurality of beams passing through the openings 62 are arranged in a line and these blanking apertures 62 are ON/OFF controlled by an appropriate control means.

In other words, the system is adapted so that the charged particle beams that have passed through the blanking apertures 62, into which the ON signal is applied, reach the specified point on the surface of object to be exposed and the specified point is exposed and the charged particle beams that have passed through the blanking apertures 62 into which the OFF signal is applied and are interrupted by an appropriate shield plate and thereby prevented from reaching the surface of object to be exposed. Then a specified pattern were exposed as if it is applied by a brush, by scanning the surface with a plurality of charged particle beams obtained by the above described ON/OFF control.

For volume production by direct exposure of wafers, it is necessary to expose a 1 cm$^2$ segment of wafer within one second or, at longest, two seconds. If the throughput is determined as described above, the second problem is the sensitivity of resists. Electrons are particles and the number of electrons that are incident into a unit area within a unit time varies in terms of the Poisson's distribution and therefore the resolution is basically in inverse proportion to the square root of the sensitivity. Accordingly, if the smallest pattern is 0.2 $\mu$m, a resist with the sensitivity of 5–10 $\mu$C/cm$^2$ is generally required. A high sensitivity resist has only a low resolution and the system for which implementation of high sensitivity is excessively expected cannot be used in actual volume production of LSIs.

Assuming a throughput of 1 cm$^2$/sec on a target value for the resist sensitivity of 5–10 $\mu$C/cm$^2$, the required overall current is 5–10 $\mu$A. Another beam size is assumed as 0.05 $\mu$m☐ on the surface of a specimen. The limit of the thermal electron gun of LaB$_6$ is a current density of 250 A/cm$^2$ to be obtained using a lens of an extremely small spherical aberration and chromatic aberration factor. Accordingly, the current density of 0.05 $\mu$m☐ is 250 A/cm$^2$ and therefore the current value of one beam is $250 \times (0.05 \times 10^{-4})^2 = 6.25$ nA. The overall current value of 1600 beams is 10 $\mu$A.

The problems in the case of exposure of the specified pattern with the above described line beams (for example, 1600 line beams) using the blanking aperture array as shown in FIG. 14 are as follows:

(1) A coulombic interaction has been considered a physical bottleneck for the charged particle beams. This coulombic interaction is a phenomenon such that the beams become dim because of interactive repulsion of electrons. The main cause of this phenomenon is that the focal distance is extended because of interactive repulsion of charged particle beams in proportion to the current value of overall electron flow in the lens near the surface of a specimen (in other words, in proportion to the number of charged particle beams in the ON state) and the focal point deviates downwardly from the specimen surface (that is, the surface of wafer 19) as shown in FIG. 7 (B).

In FIG. 7 (B), numeral 8 denotes the charged particle beam in the ON state and numerals 12 and 17 denote the electron lens for focusing as in the apparatus shown in FIG. 12. The focal deviation due to such coulombic interaction scarcely takes place when the number of charged particle beams 8 in the ON state is small, as shown in FIG. 7 (A), and instead occurs when the number of charged particle beams 8 in the ON state is large (the maximum number of beams reaches, for example, 1600 as described above), as shown in FIG. 7 (B).

The focal deviation because of said coulombic interaction can be corrected by providing a small refocus coil (for example, approximately 4 mm in diameter) at a position near the peak of the magnetic field in the final stage lens or the preceding lens (that is, a position where the magnetic field is most intensified) and supplying a refocus current in proportion to the current value of all charged particle beams (that is, the number of charged particle beams that remain in the ON state at that time) to the refocus coil at the rate of, for example, 50 nsec (50+1 sec). In this case, the rate of approximately 50 nsec is the limit of the response speed of the amplifier (analog current-driven type amplifier) for supplying the specified refocus current to the refocus coil in accordance with the number of charged particle beams that remain in the ON state at that time.

If the size of one beam is set to 0.05 $\mu$m☐ and the scanning speed is set to 100 $\mu$m/5 $\mu$sec (that is, 0.05 $\mu$m/2.5 nsec) in the stage moving direction by using the line beams through the blanking aperture array as described above, the beam dwell time per 0.05 $\mu$m (one shot of irradiation beam) is 2.5 nsec. Since such line beams are scanned at a high speed, it is necessary to vary the refocus current (for example, approximately 1A, maximum) in steps (for example, 0A to 1A) within a time far shorter than 2.5 nsec, which is the beam dwell time at the above-described point at the boundary between the exposure of a completely written-out region and the partially exposed region. However, it is impossible to obtain said response speed even with the advancement of analog current-driven type amplifiers, which have been developed recently. Accordingly, as shown in, for example, FIG. 15, for a pattern having a small projection (in other words, when the pattern B is exposed, only two beams of the line beams become ON as shown with black dots 10B and 11B in the pattern B) adjacent to a large written-out pattern A (in other words, when the pattern A is exposed, all beams arrayed in a line become ON as shown with black dots 1B, 2B ... nB in the pattern A) and for the scanning direction of the line beams shown by the arrow in FIG. 15, it is difficult to supply a correct refocus signal as described above (for supplying a correct refocus signal, the current to the refocus coil should be made to rise from approximately 0A to, for example, 1A within a far shorter time than, for example, 2.5 nsec but it is impossible as described above). If the number of line beams is increased in the charged particle beam exposure by one line beam as shown in FIG. 14, the focal deviation due to the above described coulombic interaction cannot be corrected and therefore the precision pattern writing cannot be carried out for volume production.

(2) Since the beam dwell time of 20 nsec is required for the resist sensitivity of 5 $\mu$C/cm$^2$, a current density of 250 A/cm$^2$ is insufficient for the beam dwell time of 2.5 nsec described above. A current density of 2000 A/cm$^2$ is required to obtain the dwell time of 2.5 nsec and therefore general thermal electron guns and electron lenses cannot attain this level of current density.

(3) An intermediate color cannot be represented with the conventional line beams and a pattern of dimensions as large as an integral multiple of the dimensions of a single beam cannot be formed. Though such a pattern can be formed by plural times of movement of the stage or beam scanning, the throughput is extremely low and volume production cannot be carried out.

(4) The amount of exposure with the conventional line beams cannot be reduced by a proximity effect correction.

(5) If the conventional line beams are arranged to reduce the effect of the electric field of the openings adjacent to the blanking aperture array, the irradiation points become vacant and therefore the scanning of a plurality of line beams that are slightly deviated is repeated and the throughput will be reduced. In other words, the problems associated with a blanking aperture array that comprises the above described plurality of blanking apertures 62 arranged in a row can be summarized as described below.

The exposure efficiency with the charged particle beams can be improved by using the blanking aperture array, whereas a resist that provides a higher resolution should be used in accordance with the degree of precision of a pattern to be exposed and therefore the exposure time becomes longer and the throughput is reduced.

In the blanking aperture system, there is a problem in that the lens system is affected by the total amount of charged particle beams that pass through the above described blanking apertures. Therefore the focal point deviates and the pattern is dimmed. When exposing, for example, a pattern as shown in FIG. 15, there is a problem in that the total amount of charged particle beams passing through the blanking aperture array substantially varies in the exposure of the B row pattern after exposure of the A row pattern. In addition the focal distance of the charged particle beam exposure system deviates significantly. Therefore, a considerably large current is required and it takes a certain period of time for correction.

For this reason, it is necessary to provide a special control adjustment circuit.

In addition, in the blanking aperture system, the exposure should be carried out through the blanking apertures that are arranged as close to each other as possible to prevent such defects as deformation or discontinuity of the pattern or the like. However, the charged particle beams have a fixed intensity distribution as described above. Therefore there is the so-called proximity effect that adjacent charged particle beams interfere with each other and the pattern is exposed beyond the predetermined amount of irradiation. For example, it is necessary to adjust the amount of irradiation of the charged particle beams at the center and both ends of the blanking aperture array. However, such adjustment has been difficult in the conventional blanking aperture array.

In some cases, it is necessary to vary the amount of irradiation on part or all of the pattern, depending on the shape of the pattern or the relative position of the pattern to other patterns, but such variation cannot be implemented by the conventional blanking aperture array.

Some examples of two-dimensional arrangement of the groups of blanking apertures in the above described blanking aperture array unit have been known to solve the above problems. In the blanking aperture array unit provided with the blanking apertures that are two-dimensionally arranged as described above, all charged particle beams forming the specified pattern passing through the blanking aperture array unit are simultaneously irradiated onto the specified position of an object to be exposed to carry out an exposure process and subsequently all charged particle beams formed in the same or different pattern are simultaneously irradiated onto an adjacent object to be exposed to carry out the exposure processing. If the total amount of charged particle beams passing through the blanking apertures of the above described blanking aperture array unit largely differs with each pattern, a refocusing problem as described above occurs, the proximity effect problem is not resolved and there is no possibility of varying the amount of irradiation onto part of the specified pattern.

Further, a high speed pattern forming method is disclosed by U.S. Pat. No. 4,153,843 in which a blanking aperture array provided with a plurality of blanking apertures arranged in two dimensional form is used. Thus, a plurality of charged particle electron beams are radiated on a surface of a sample to be exposed to the beam to form a predetermined pattern thereon, and a total amount of radiation value is received at a certain addressed position of the sample to which a respective charged particle electron beam is to be exposed.

In the method disclosed in the U.S. Pat. No. 4,153,843, as shown in FIG. 20, each one of the charged particle electron beams formed by each one of the apertures A, D, and G forming a first aperture line arranged parallel to a scanning direction Y of the charged particle electron beams radiates each one of addressed positions of the sample forming one line 1 arranged parallel to the scanning direction Y of the charged particle electron beams. Each one of the charged particle electron beams formed by each one of the apertures B, E, and H forming a second aperture line arranged parallel to a scanning direction Y thereof radiates each one of addressed positions of the sample forming another line 6 arranged parallel to the scanning direction Y thereof. Each one of the charged particle electron beams formed by each one of the apertures C, F, and I forming a third aperture line arranged parallel to a scanning direction Y thereof radiates each one of addressed positions of the sample forming another line 11 arranged parallel to the scanning direction Y.

The charged particle electron beams formed by apertures forming respective lines radiate addressed positions formed on any one of the lines on the sample, and each line is separated by a predetermined space from each other.

Accordingly, the spaced addressed positions are successively radiated by each one of the charged particle electron beams formed by each one of the aperture lines formed in the aperture array and thereby all addressed positions are ultimately fully exposed; this method is generally called an interleave method.

Thus, the charged particle electron beams formed by the aperture A exposes sequentially, continuously arranged addressed positions to form in turn a line on the samples, (1, a), (1, b), (1, c) . . . (1, 1), (2, 1), (2, k), . . . (2, a), (3, a), (3, b), . . . (3, 1).

On the other hand, the charged particle electron beams formed by the aperture B exposes sequentially, continuously arranged addressed positions to form in turn a line on the samples, (6, a), (6, b), (6, c) . . . (6, 1), (7, 1), (7, k), . . . (7, a), (8, a), (8, b), . . . (8, 1).

Further, the charged particle electron beams formed by the aperture C exposes sequentially, continuously arranged addressed positions to form in turn a line on the samples (11, a), (11, b), (11, c) . . . (11, 1), (12, 1), (12, k), . . . (12, a), (13, a), (13, b), . . . (13, 1).

The characteristic feature of the conventional technology is such that a plurality of addressed positions formed on the sample, each of them being separated a predetermined distance from each other, are simultaneously and respectively exposed to different charged particle electron beams in a predetermined exposed region.

In the conventional technology, the charged particle electron beams formed by the apertures D and G in the first aperture line formed by the apertures A, D, and G expose the same addressed position to which the charged particle electron beam formed by the aperture A exposes successively with a predetermined time difference. Therefore, in the embodiment as shown in FIG. 20, one of the addressed positions in the sample to be exposed will be exposed three times by the charged particle electron beam and therefore, a dose value of the same addressed position caused by the exposure of the beams can be optionally changed by changing the exposure number within 3 times. The conventional technology, however, discloses that each of the charged particle electron beams exposes each one of the addressed positions respectively and thus control of the beam is difficult.

Therefore, a problem arises in that when the beam exposes all of a predetermined region to be exposed, a disconnected portion among the pattern to be formed will appear because of a displacement of the beam from an addressed position to be correctly exposed. The disconnected portion should have been connected.

Accordingly, in the conventional technology, since the charged particle electron beams expose addressed positions separated from each other, an aberration and a reduction ratio of each one of the charged particle electron beams changes because of the difference in the distance from the optical axis. Thus, another technology is required to adjust the displacement. Further in the conventional technology, since the controlling operation for controlling the deflection of the beam to realize the interleave operation becomes difficult, the beam controlling circuit becomes complicated.

Moreover, in the conventional technology, a predetermined time should be required from the time when the beams have exposed one addressed position to the time when the same beams expose another adjacent addressed position.

Generally, a light sensitive layer formed at a predetermined addressed position is affected by another beam that exposes another addressed position next to the predetermined addressed position. Thus in the conventional technology, since the exposure time is different, the exposed condition of the sensitive layer of one addressed position will change as time elapses.

Accordingly, it becomes difficult to maintain the light sensitive condition of the predetermined addressed position at the predetermined level, and a uniform exposure operation cannot be expected.

SUMMARY OF THE INVENTION

An object of the present invention is to provide a means for solving the various above described problems in the exposure method by the conventional line beams; Particularly, the present invention comprises a charged particle beam exposure system capable of easily correcting the focal deviation of charged particle beams due to the above described coulombic interaction to allow the formation of a sharp pattern when any type of exposure pattern is used and the number of charged particle beams is increased, and capable of appropriately varying the amount of irradiation of charged particle beams for each pattern. Thereby the proximity effect can be prevented and a pattern having a desired exposure condition can be efficiently formed. In addition, the primary object of the present invention is to obtain a charged particle beam exposure system in which line connections to the electrodes on the blanking aperture array are easy.

The present invention for solving the above described problems is to provide a method for exposing a charged particle beam and a charged particle beam exposure system of a configuration as described below.

Specifically, a method for exposing a charged particle beam to an object to be exposed with a charged particle beam exposure system comprising a charged particle beam generating means for generating a charged particle beam, a blanking aperture array means for shaping the charged particle beam generated by the charged particle beam generating means and having a plurality of blanking apertures arranged in two dimensional form, a stage means for holding an object to be exposed, a deflection means for deflecting the charged particle beam passing through the blanking aperture array means by a specified amount in order to irradiate the charged particle beams onto a specified position of the object to be exposed. The method for exposing a charged particle beam to an object to be exposed with a charge particle beam exposure system comprising a first step of irradiating a pattern formed by the charged particle beams arranged in the two dimensional configuration on a first region specified on the object to be exposed, a second step of successively irradiating the pattern formed by the charged particle beams arranged in the two dimensional configuration on a second region having an overlapping region in which at least a portion of the second region and at least a portion of the first region overlap each other on the object to be exposed, and wherein when the charged particle beams are irradiated on the object to be exposed, first charged particle beams passing through a first blanking aperture irradiates a specified first region on the object to be exposed in the first and in the second steps, second charged particle beams passing through a second blanking aperture arranged next to the first blanking aperture overlaps and irradiates a region closely arranged to the first region so that the specified position in the overlapping region is overlapped and irradiated a plurality of times by respective charged particle beams each having a certain irradiation amount set by dividing a total irradiation amount of the position on the object to be exposed by a predetermined number of radiating steps.

In a method for exposing the charged particle beam in accordance with the present invention, a group of charged particle beam, having a specified pattern that have passed a plurality of blanking apertures two-dimensionally arranged, are not simultaneously irradiated onto the specified position of the object to be exposed, unlike the prior art system, and part of the specified pattern to which the specified position of the object is exposed is divided and irradiated a plurality of times. In addition, the charged particle beams to be irradiated onto the specified position of the object to be exposed are supplied through different blanking apertures, respectively.

Accordingly, the unit exposure points that form a pattern on the object to be exposed overlap and are irradiated as many times as specified with the above described plurality of charged particle beams.

More specifically, for example, the blanking aperture array control unit is constructed so that the same pattern as the specified pattern to be exposed to the charged particle beams or the same pattern as at least part of the specified pattern is formed with the groups of blanking apertures that remain in the ON state at a specified region of the object to be exposed. The specified pattern is moved on the blanking aperture array in the specified direction while synchronized with the deflection scanning of the charged particle beams.

Movement of the pattern on the blanking aperture array and deflection scanning of the charged particle beams by means of electromagnetic deflection are controlled by an appropriate control means so that the charged particle beams are irradiated onto the same position of the object to be exposed even when the charged particle beams forming part of a special pattern by exposure pass through different apertures of the blanking apertures on which the pattern moves.

In other words, the construction is such that the specified region of the object to be exposed is exposed, in a specified pattern, to the charged particle beams passing through the specified blanking apertures of the blanking aperture array that remain in the ON state when the charged particle beams are scanned by the electromagnetic deflection means. Further, the specified position and the ambient part of the object to be exposed overlap and are irradiated in sequence with a plurality of charged particle beams that have passed through different blanking apertures at a specified time interval when the blanking aperture array control unit controls the movement of the specified pattern, which is formed on the blanking aperture array, in one direction.

According to the above described construction, the amount of irradiation necessary for the resist provided on the object to be exposed to completely form a pattern is divided a plurality of times (n times) when forming the specified pattern to be formed on the object to be exposed. Therefore, the intensity of the charged particle beams irradiated at one time is 1/n of the amount of irradiation generally required for forming the pattern. Even though the pattern to be exposed is suddenly changed, the electron density of each charged particle beam is extremely small. Therefore, the above described refocus problem will not occur, and the refocusing operation is easily carried out in a short period of time because the focal deviation is slight even though such deviation occurs.

In addition, in the present invention, the charged particle beams are scanned and irradiated in sequence in, for example, the stage direction of the groups of blanking apertures provided on the blanking aperture array. Therefore, the variation of electrons, due to the groups of charged particle beams that change at a time, is far smaller than the whole blanking aperture array and there is no possibility of the refocus problem occurring.

In the present invention, the charged particle beams for forming a specific part of the specified pattern pass through the blanking apertures, which are individually controlled and, at the same time, the charged particle beams supplied from different blanking apertures overlap and are irradiated in sequence onto the same position of the object to be exposed at a specified time interval. Depending on the case, the number of overlapping irradiations can be freely changed by changing over the ON state of the specified blanking apertures to the OFF state to reduce the number of times of irradiating operations and the disadvantages associated with the prior art can be eliminated.

In the present invention, the speed of an irradiating operation is substantially increased because the intensity of charged particle beams required to form each pattern can be reduced. The construction of the apparatus can be small because the configuration of the control stages can be simplified.

In addition, the groups of blanking apertures provided on the blanking aperture array are arranged in a checkered pattern so that, for example, the first aperture stage and the second aperture stage do not contact each other. Therefore, even when there are many groups of apertures, line connection to the electrodes provided on the blanking apertures is easy and the specified pattern of the object to be exposed can be exposed without clearance and in a coordinate direction orthogonally intersecting the scanning direction with the charged particle beams passing through the first row of openings and the charged particle beams passing through the second row of openings of the groups of blanking apertures.

BRIEF DESCRIPTION OF THE DRAWINGS

FIG. 7 (A-C) are diagrams illustrating the function of the refocus.

FIG. 10 (A-B) are diagrams of an exposure pattern shifted by a smaller size than the beam size according to the exposure method of the present invention.

FIG. 16 (-C) are diagrams of a practical example of another exposure method for the charged particle beam exposure system in accordance with the present invention.

DESCRIPTION OF THE PREFERRED EMBODIMENTS

The following describes a practical example of the charged particle beam exposure system in accordance with the present invention.

Figure 12:
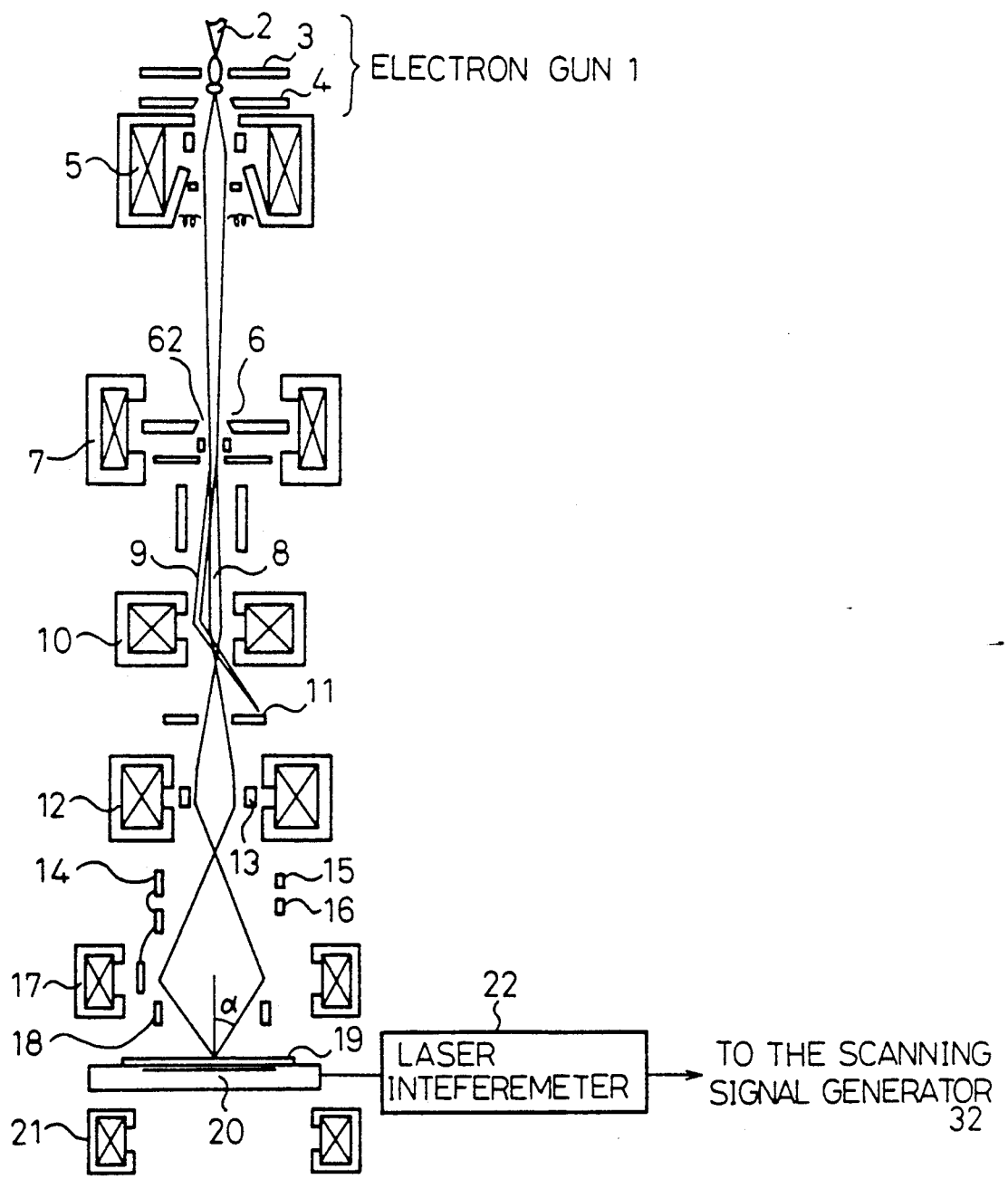
FIG. 12 is a diagram of an example of the overall configuration of the charged particle beam exposure system in which the method in accordance with the present invention is to be embodied.

FIG. 12 is a diagram that exemplifies the overall configuration of the charged particle exposure system related to the present invention. In FIG. 12, the electron gun 1 comprises a cathode 2 composed of $LaB_6$ and others, a grid 3 and an anode 4. Numerals 5, 7, 10, 12, 17 and 21 respectively denote electron lenses for convergence. A blanking aperture array 6 construction as described later is provided in the electron lens 7. Numeral 8 denotes the so-called ON beam, which passes through the blanking aperture to the electrode of which an ON signal is applied among the blanking apertures provided in the blanking aperture array 6 and is irradiated onto the specified point on the object (wafer surface) 19 to be exposed. Numeral 9 denotes the so-called OFF beam, which passes through the blanking aperture to the electrode of which an OFF signal is applied among the blanking apertures provided in the blanking aperture array 6 and is interrupted by an appropriate shielding means, for example, the shield plate 11 provided below the blanking aperture array and is not irradiated onto the surface of the object to be exposed. The above described refocus coil 13, which converges the charged particle beams to a specified size onto a specified position, is provided in the electron lens 12 immediately preceding the final stage in the lens system for focusing on the surface of the object to be exposed.

Numeral 14 denotes the main deflector (which is generally formed with a coil) and numeral 18 denotes the sub deflector (which is generally formed with a static electrode). The charged particle beams (ON beams) 8 are deflected in a specified direction for main deflection and sub deflection. Numeral 15 denotes the dynamic focus, which corrects the position of the focal point in accordance with the deflecting position of the charged particle beams. In addition, numerals 16 denotes the dynamic stig, which corrects the shape of charged particle beams irradiated onto the specimen (for example, correction for rounding the shape of the charged particle beams).

Numeral 20 denotes the stage for supporting the object to be exposed 19 and the movement of this stage is detected by the laser interferometer 22. The detection signal of the laser interferometer is supplied to the scanning signal generator 32 described later. Specifically, the laser interferometer 22 reads the position of the stage 20 and feeds back its reading to the scanning signals of the charged particle beams so that the charged particle beams are deflected as much as the movement of the stage. Thereby, the charged particle beams can be irradiated onto a specified position on the specimen surface 19 even though the stage 20 moves.

Figure 13:
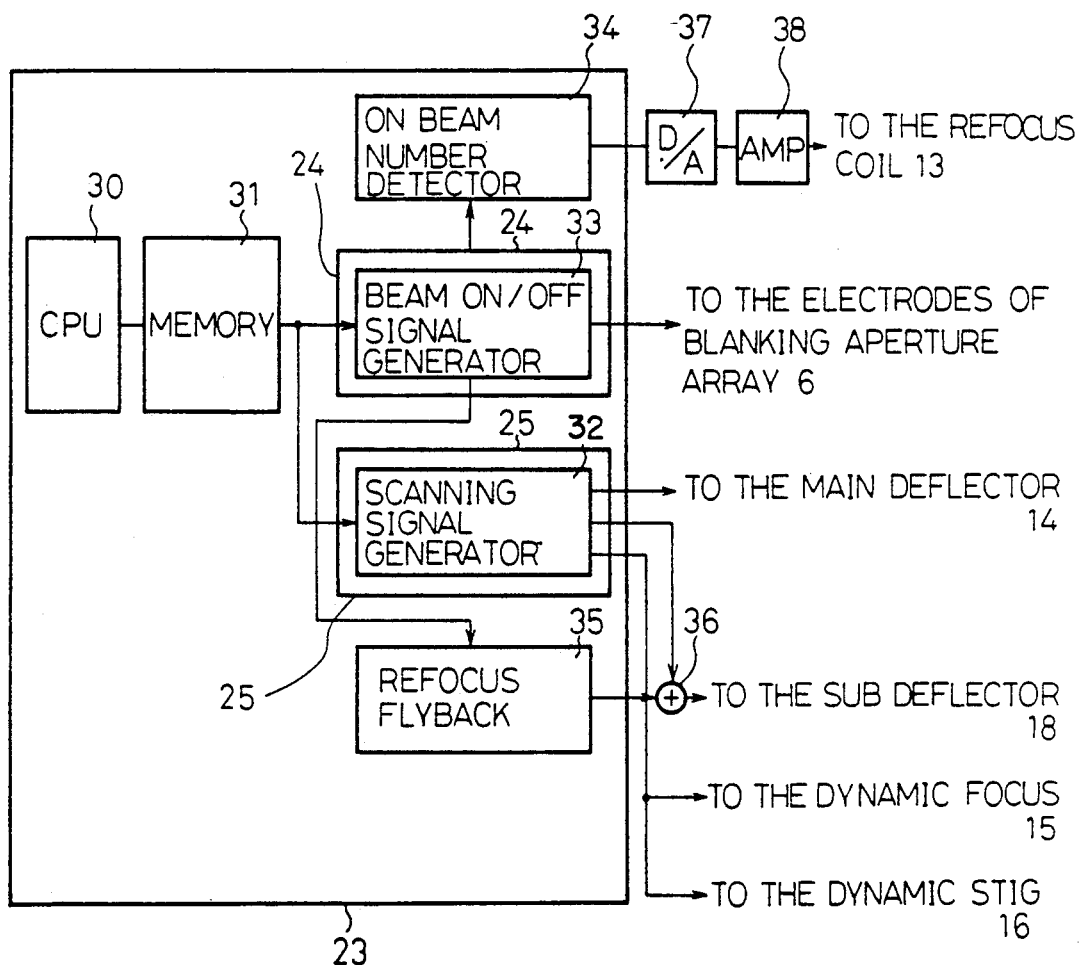
FIG. 13 is a circuit connection diagram of the electrical system to be connected to the sections of the apparatus of FIG. 12.
Figure 14:
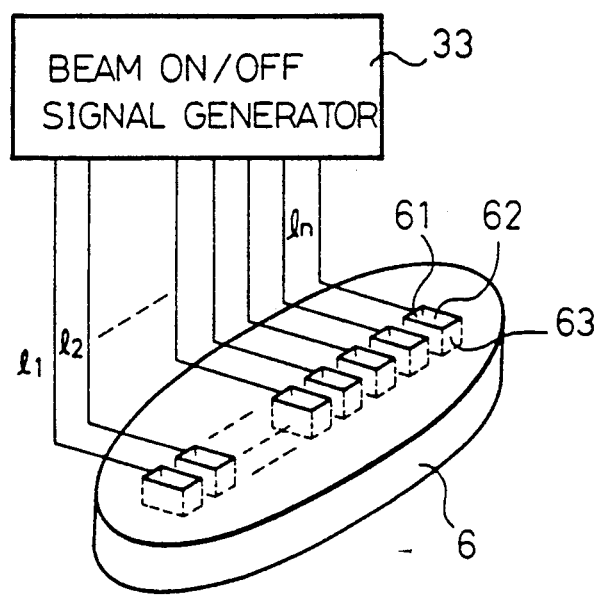
FIG. 14 is a diagram of an example of the configuration of the prior art blanking aperture array.
Figure 15:
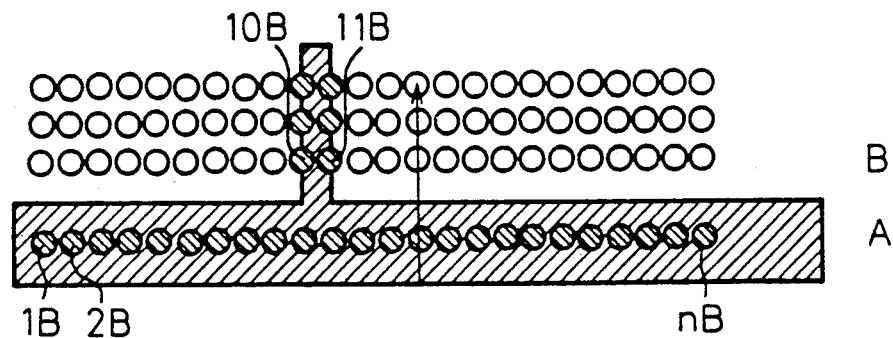
FIG. 15 is a diagram describing an exposure problem using the prior art blanking aperture array.

As a basic configuration, the charged particle beam exposure system in accordance with the present invention comprises a charged particle beam generating means 1, which generates a charged particle beam; a blanking aperture array 6, which has a plurality of blanking apertures 62; a stage means 20, which supports an object 19 to be exposed; an electromagnetic deflection means 14 and 18, which deflects the charged particle beams as much as specified to irradiate the charged particle beams at a specified position of the object to be exposed; lens means 5, 7, 10, 12, 17 and 21 for contracting the charged particle beams to a specified magnification for irradiating the charged particle beams in the specified size onto the specified position of the object 19 to be exposed; and a control means 23, which controls at least one of the above described means as shown in FIG. 13.

The control means 23 comprises a central processing unit 30; a control system 24, which controls a blanking aperture array means 6 formed with a plurality of blanking apertures 62 provided in a two-dimensional arrangement, and an electromagnetic deflection means 25, which deflects the charged particle beams by a specified amount in a specified direction in order that the charged particle beams generated from the charged particle beam generating means pass through the blanking apertures and are deflected as specified in a specified direction. The control system 24, which controls an ON/OFF state of the blanking apertures of the blanking aperture array means 6, is provided with a beam ON/OFF signal generating means 33, which is controlled with data read out from the memory 31. The electromagnetic deflection means 25 is provided with a scanning signal generating means 32, which is controlled with a signal output from the beam ON/OFF signal generating means 33 of the control system 24 to control the above described main deflector 14 in accordance with the data read out from the memory 31 and also control the sub deflector 18 through an adder 36.

The control signal output from the scanning signal generating means is also supplied to the dynamic focus 15 and the dynamic stig 16.

Numeral 34 denotes the ON beam number detector, which is connected to the output side of the beam ON/OFF signal generator 33 and detects the number of charged particle beams that remain in the ON state at that time. Digital values in accordance with the number of detected charged particle beams are converted to the analog values by the D/A converter 37 and the specified refocus current is supplied to the refocus coil 13 through the amplifier (the above described analog current drive amplifier) 38.

Numeral 35 denotes the refocus flyback circuit connected to the output side of the beam ON/OFF signal generator 33 to supply a deflection signal in proportion to the number of the charged particle beams that remain in the ON state together with a scanning signal from the scanning signal generator 32 to the sub deflector 18 through the adder 36; thereby, the deflection positional deviation (a lateral deviation as shown with a dot line in FIG. 7 (C)) of the charged particle beams, when the refocus current is supplied, is compensated.

Figure 1:
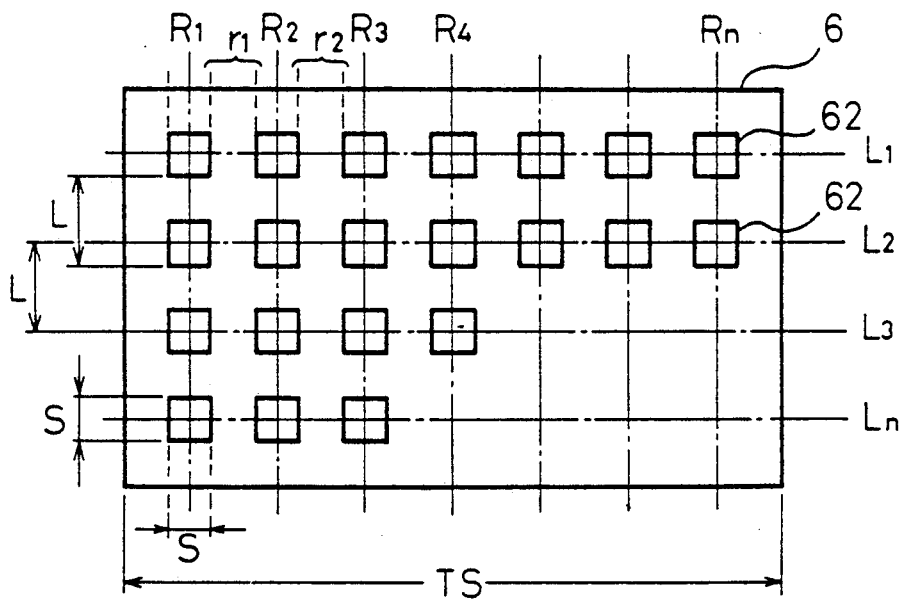
FIG. 1 is a diagram of the basic configuration of the blanking aperture array used in the present invention.

An example of the basic configuration of the blanking aperture array 6 used in the present invention is shown in FIG. 1.

In the blanking aperture array 6 used in the present invention, a number of blanking apertures 62 are two-dimensionally arranged in order under the conditions as described below.

FIG. 1 is a plan view showing an example of the basic configuration of the blanking aperture array means 6 used in the present invention, and a plurality of blanking apertures 62 of the blanking aperture array means 6 have the same area of aperture and preferably have almost the same sectional profile.

In addition, the plurality of blanking apertures 62 are arranged in an orthogonal matrix having a plurality of rows and a plurality of stages (i.e. columns) with equal clearance therebetween both in the vertical and in the horizontal direction.

The stage (L) direction of the blanking apertures 62 of the blanking aperture array means 6 in the present invention is the direction the charged particle beams are deflected and scanned in the sub field, described later, by the sub deflector 18, that is, a direction that orthogonally intersects the moving direction of the stage 20. The row (R) direction of the blanking apertures 62 is the direction the charged particle beams are deflected and scanned in the sub field, described later, by the sub deflector 18, that is, a direction that coincides with the moving direction of the stage 20.

Though the clearance in the row direction of the blanking apertures 62 in the blanking aperture array means 6 according to the present embodiment, that is, the clearance r1 between the blanking apertures of row R1 and those of row R2, is not specified, it should be set to prevent the charged particle beams that have passed through the blanking apertures 62 from excessively overlapping and result in an excessive proximity effect and deformation of the specified pattern or adjacent patterns from being discontinued when the object to be exposed is exposed to the charged particle beams to form the specified pattern.

The overall width TS in the row direction of the blanking apertures in the blanking aperture array means 6 is preferably such that the clearance thereof and the number of rows of blanking apertures are set so that the overall width is at least equal to the width ws of the sub field the charged particle beams scan.

In addition, the clearance in the stage direction of the blanking aperture array means 6 in the present embodiment is not limited and is less restricted than the clearance between the rows. It can be determined taking into account the scanning speed of the charged particle beams, the moving speed of the specified pattern in the blanking aperture array means 6, and the moving speed of the stage.

The overall width TL of the stage direction in the blanking aperture array means 6 is also not limited. As described later, the number of stages is determined depending on the number of times of overlapping irradiation of the charged particle beams onto the specified position of the object to be exposed. Therefore, the overall width TL should be such that it can include at least the number of stages thus determined.

Figure 2:
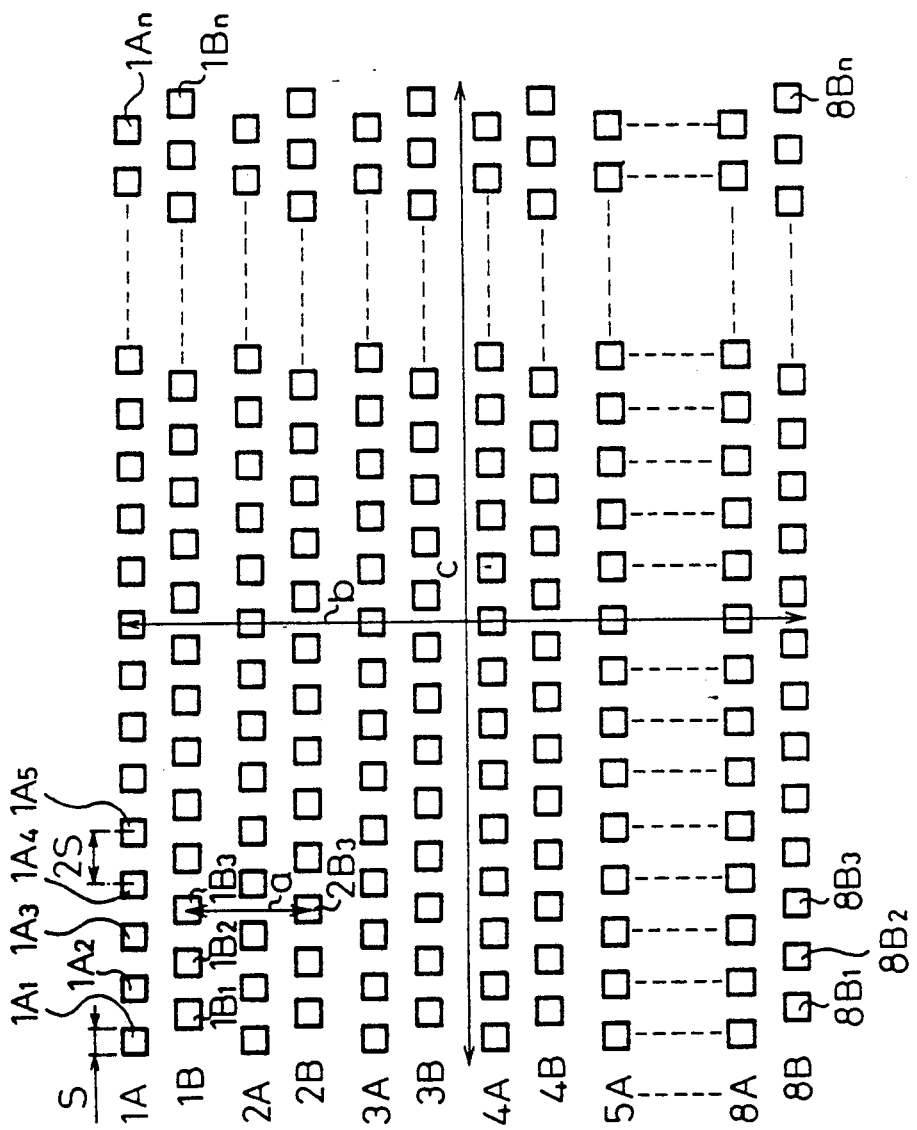
FIG. 2 is a diagram of another configuration of the blanking aperture array used in the present invention.

FIG. 2 is a plan view showing the configuration of another embodiment of the blanking aperture array means 6 in accordance with the present invention. This embodiment has a configuration in which a plurality of blanking apertures 62 that form one stage L1 and a plurality of blanking apertures 62 that form the other adjacent stage L2 are provided in different arrangement phases in the row direction.

In the embodiment shown in FIG. 2, the blanking apertures 62 forming the first stage L1 and those forming the second stage L2 are provided in a zigzag arrangement.

In other words, in FIG. 2, each of the blanking apertures 62 has a square cross section, a side of which has the length S.

As shown in FIG. 2, there are arranged a plurality of aperture stage groups (8 groups, for example, as 1A, 1B; 2A, 2B; ... ; 8A, 8B) each of which (comprising, for example, 1A and 1B) comprises the first aperture stage, for example, 1A (some of the apertures are indicated as $1A_1$, $1A_2$, $1A_3$, $1A_4$, $1A_5$, ... $1A_n$ and the number of apertures is, for example, 64) arranged and deviating from one another as much as 2S (50 $\mu$m as an example, 0.1 $\mu$m in terms of dimensional conversion on the specimen) in a direction at right angles to the scanning direction (the vertical direction on the drawing) of the charged particle beams; and the second aperture stage, for example, 1B (some of the apertures are indicated as $1B_1$, $1B_2$, $1B_3$, ... $1B_n$ and the number of apertures is, for example, 64 the same as the number of apertures of the first aperture stage), which are arranged while being deviated by the specified distance from the first aperture stage 1A in the scanning direction of the charged particle beams (the vertical direction in the drawing) and by S (25 $\mu$m in the above case, or 0.05 $\mu$m in terms of dimensional conversion on the specimen) from the first aperture stage in a direction at right angles to the scanning direction of the charged particle beams.

Accordingly, in the above case, the dimension a shown in FIG. 2 (that is, for example, a deviation between the aperture stage 1B and the aperture stage 2B) is 100 $\mu$m (0.2 $\mu$m in terms of dimensional conversion on the object to be exposed), the dimension b is 800 $\mu$m (1.6 $\mu$m in terms of dimensional conversion on the object to be exposed), and the dimension c is 3200 $\mu$m (6.4 $\mu$m in terms of dimensional conversion on the object to be exposed). As described above, if the number of apertures of one aperture stage, for example, 1A is 64, the number of apertures of one aperture stage group (for example, comprising 1A and 1B) is 128 and the total number of apertures of all aperture stage groups is $128 \times 8 = 1024$.

In the present embodiment, a plurality of blanking aperture stages provided in different arrangement phases are formed as a group and a plurality of groups are repeatedly formed.

Figure 3:
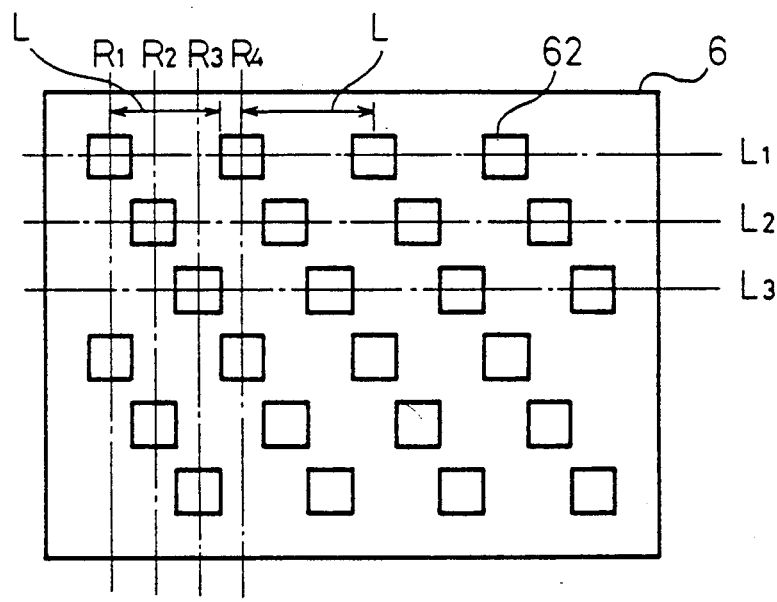
FIG. 3 is a diagram of a third configuration of the blanking aperture array used in the present invention.

FIG. 3 shows another embodiment of the blanking aperture array means 6 in accordance with the present invention. In this embodiment, a plurality of types of blanking aperture stages in different phase arrangements are used and the distance between blanking apertures 62 in one aperture stage is as large as an integral multiplication of the example shown in FIG. 2.

In this embodiment, assuming that the width of individual blanking apertures in the row direction is S and the number of a plurality of blanking aperture stages provided in a different arrangement phase is n, the distance L in the row direction of adjacent blanking apertures 62 in one blanking aperture stage is set to be nS or an approximate value nS.

FIG. 16 is a diagram illustrating a configuration of the blanking electrodes in the blanking aperture array means 6 shown in FIGS. 1 to 3.

All blanking apertures 62 of the blanking aperture array means 6 are respectively provided with an electrode means 60 that is set to the ON state when the charged particle beams generated by the charged particle beam generating means 1 pass through the blanking apertures 62 and reach the object to be exposed 19 or to the OFF state when the charged particle beams are deflected when passing through the blanking apertures 62 and prevented from reaching the object to be exposed 19. The electrode means is adapted to be controlled so that the electrode means is selectively set to the ON state or the OFF state, depending on whether or not the specified voltage is applied by the blanking aperture array control unit 24.

The electrode means 60 comprises two independent electrode parts 65 and 66 provided near two opposing faces of the blanking aperture, wherein one electrode part 65 is connected to the blanking aperture array control unit 24 and the other electrode part 66 is grounded.

In the embodiment of the blanking aperture array means 6 in accordance with the present invention, the control signal line 67 from the blanking aperture array control unit 24 is extended from both ends 70 and 71 in the stage direction of the blanking aperture array means 6 toward the inside of the hollow spaces 73 and 74 formed between the rows of the blanking apertures, and the line 67 is connected to respective electrodes 65 of the blanking apertures. At the same time, the grounding part 68 is provided near the center of the blanking aperture array and the grounding wire 69 is connected from the grounding part 68 to the electrode 66 of each blanking aperture 62.

The following describes a configuration example of line connection to the electrodes of the blanking aperture array means 6 according to the prior art and a problem associated with the line connection.

Figure 17A:
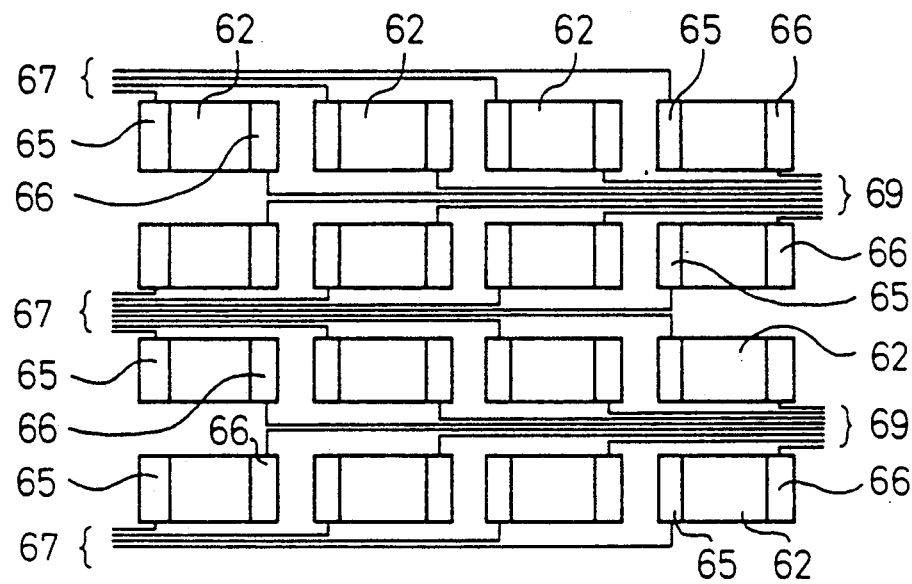
FIG. 17 (A-B) are diagrams of an example of line connections of the prior art blanking aperture array.

In the prior art, as the wiring method for the variable voltage electrode 65 to be connected to the control means provided on the blanking apertures 62 and the constant voltage electrode 66 to be connected to the constant voltage power supply, such as a grounded power supply, a plurality of wires 67 for the variable voltage electrode and a plurality of wires 69 for the constant voltage electrode are arranged from the outer periphery of the blanking aperture array means 6 toward the inside so that they do not intersect each other as shown in FIG. 17(A).

In the case of such wiring construction, however, the distance between adjacent blanking apertures 62 should be increased because the number of lines increases as the number of blanking apertures 62 increases but the size and distance of the blanking apertures cannot be excessively large.

This is related to the size of the charged particle beam irradiation region on the blanking aperture array means 6, desired pattern rules, contraction percentage (optical system), and relationship between the aperture and the distance between the blanking apertures (the charged particle beams that have passed through the apertures should be observed as if they are continued).

Figure 17B:
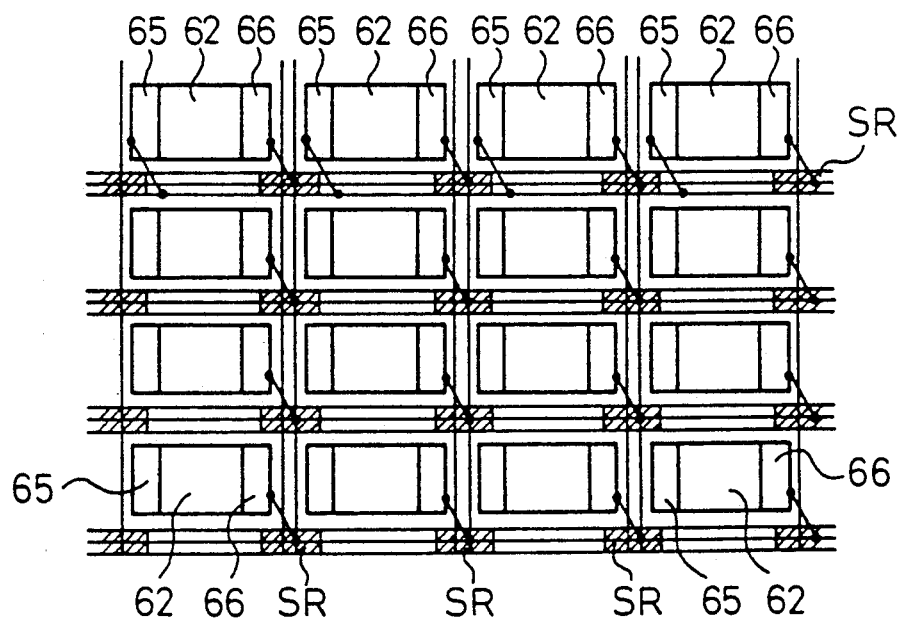

On the contrary, a system has been proposed in which, as shown in FIG. 17(B), shift register elements SR are mounted on a plurality of regions J surrounded by the openings of the blanking apertures and a control voltage is applied, while sending the signals to the shift register elements and selecting the opposing electrodes 65 and 66. (Refer to Patent Application Disclosure HEI 2-12436.)

However, in such a system, it takes a long time to select the opposing electrodes 65 and 66 by sequentially driving the shift register elements SR with clock pulses, and therefore the throughput deteriorates.

In addition, the charged particle beams are also irradiated to the shift register elements SR. Therefore, a faulty operation is apt to occur resulting in a defective pattern.

In the embodiment in accordance with the present invention, the method of line connection to the blanking apertures is improved as described below to eliminate the defects of the prior art method.

Figure 18A:
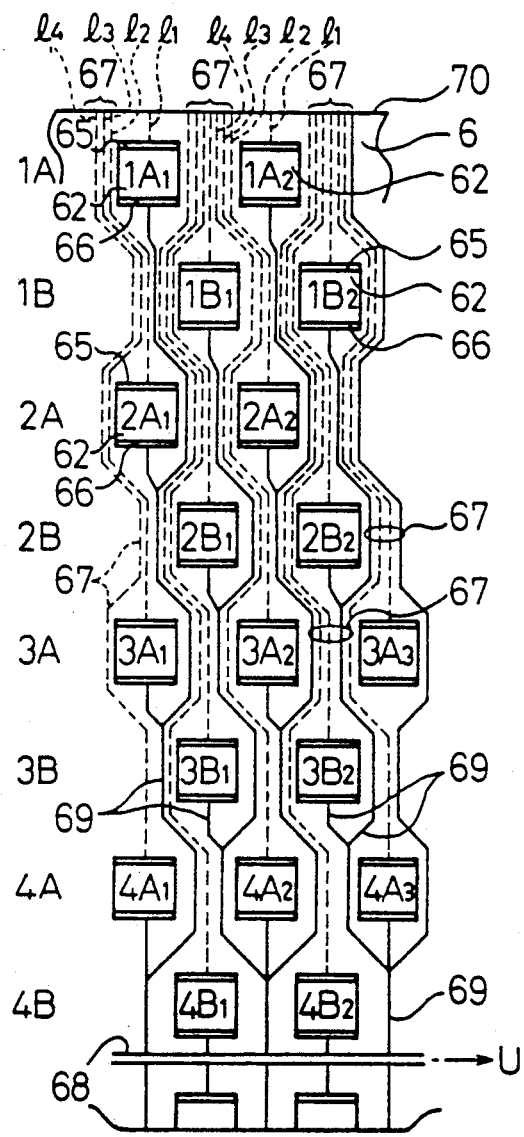
FIG. 18 (A-B) are diagrams of an example of line connection pattern to the blanking electrodes in the blanking aperture array of FIG. 1.
Figure 18B:
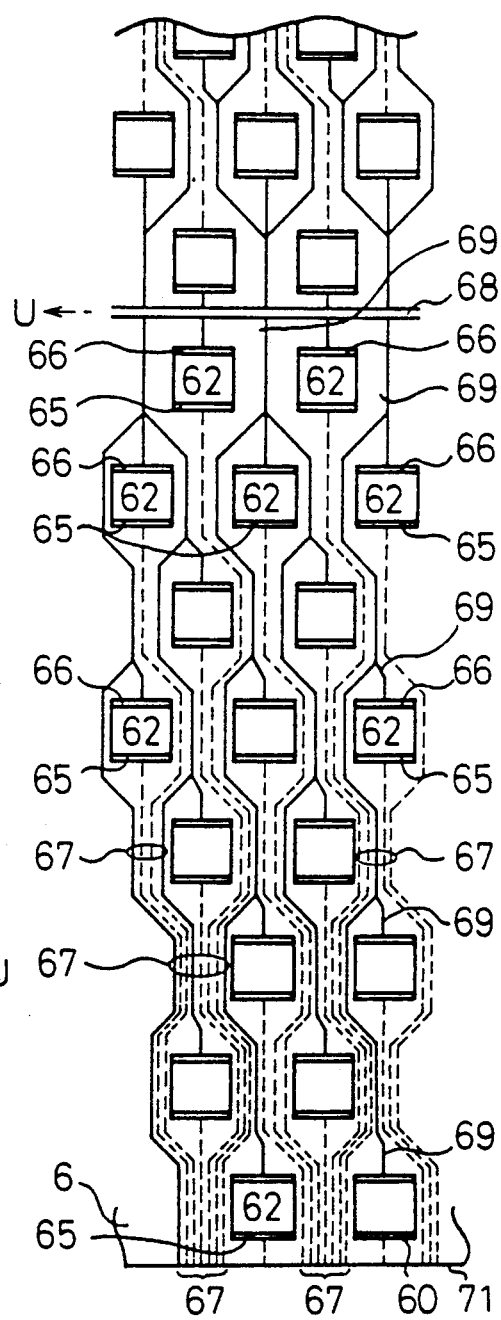
Figure 19:
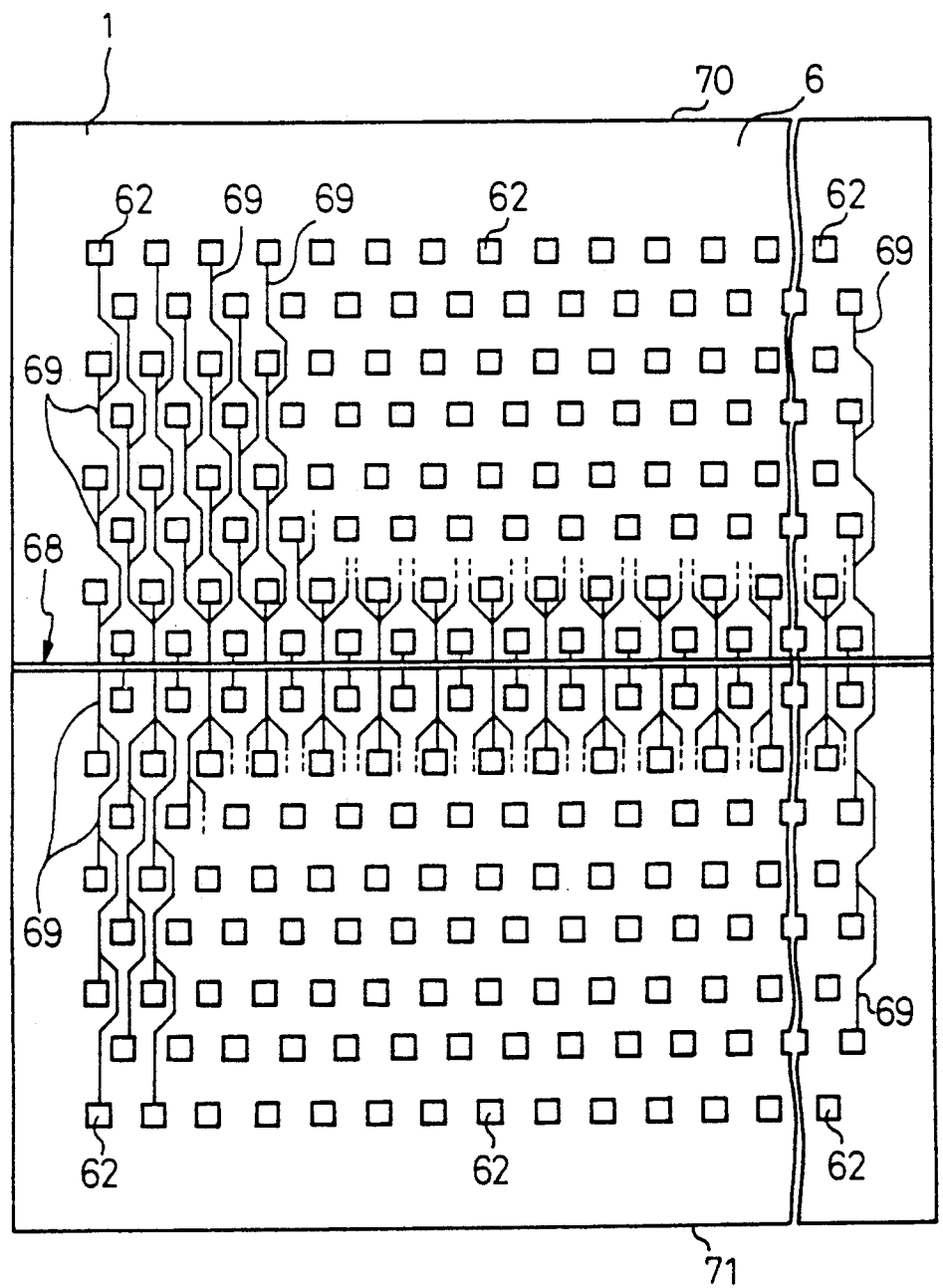
FIG. 19 is a diagram showing an example of connection of the constant voltage applying circuit to the blanking electrodes in the blanking aperture array shown in FIG. 1.
Figure 20:
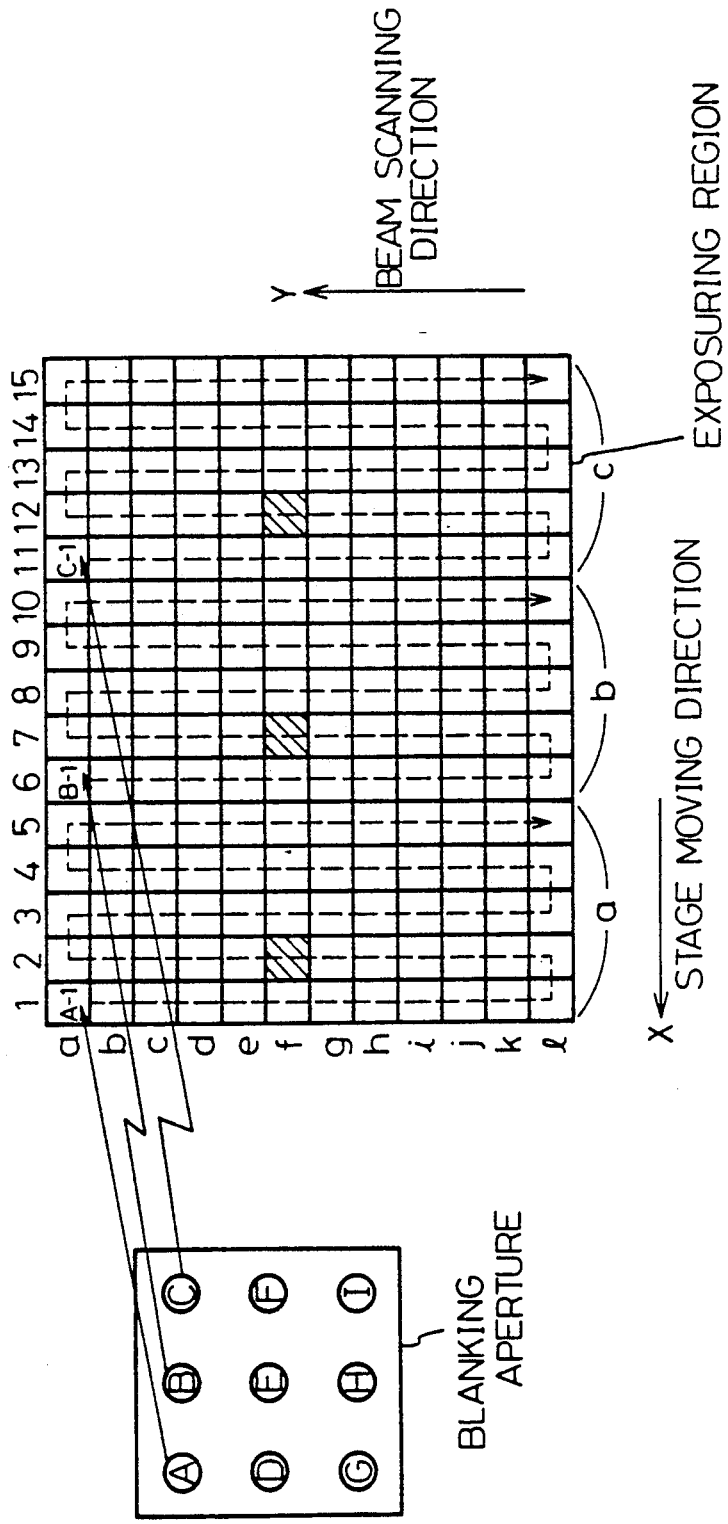
FIG. 20 is a diagram of a conventional exposure method.

As shown in FIGS. 18 and 19, the system employs a construction provided with the main line part 68 connected to the constant voltage power supply part in the charged particle beam passing region; a constant voltage applying wire 69 extended and branched to form the main line part 68 to each of surrounding blanking apertures and connected to the constant voltage electrode 66 of the blanking apertures; and the variable voltage applying wire 67 extended from the outer periphery of the charged particle beam passing region of the blanking aperture array means 6 and connected to the variable voltage applying electrode 65 of the blanking apertures 62.

It is preferable that the variable voltage applying electrodes 65 of the opposing electrodes 60 provided on the blanking apertures 62 of the blanking aperture array means 6 in accordance with the present invention are arranged toward the outer periphery of the blanking aperture array means 6, and the constant voltage electrodes 66 are arranged in a direction where the main line part 68 of the blanking apertures is located.

One constant voltage applying wire 69, which is integrated by using the above described line connection configuration, is branched at a point nearby the blanking apertures 62 and one of the branched lines is connected to one of the electrodes. Therefore, the number of wires passing through the space between the blanking apertures is reduced and the area of the wiring region is also reduced.

In addition, in such a system, a signal can almost be simultaneously sent to the electrodes 65 and 66 provided on a plurality of blanking apertures 62, and therefore, the electrode is instantaneously selected and the throughput is improved.

Since the elements are not formed in the charged particle beam irradiation region in the blanking aperture array means, a faulty operation does not occur.

In addition, an intersection of the integrated constant voltage applying wire 69 and the variable voltage applying wire 67 is avoided. Only one centralized part is satisfactory as a part to which a constant voltage is applied. The number of connecting points between the drive circuit for sending the pattern signals and the blanking aperture array means 6 can be reduced.

Since the constant voltage electrodes 66 of the blanking apertures 62 are arranged in a direction of the main line part 68 of the blanking apertures, the line connection passage for the constant voltage applying wire 69 and the constant voltage electrode 66 is shortened and an expansion of the wiring region is prevented.

The following describes the variable voltage applying wire 67 to be connected to the variable voltage electrodes 65 of the blanking apertures in this embodiment. In the blanking aperture array means 6 in which there are 16 stages, each of which is formed by a plurality of blanking apertures 62 as shown in FIG. 19 where the array of the blanking apertures of odd-numbered stages is deviated by one pitch from the array of the blanking apertures of even-numbered stages in the array configuration, a set of eight variable voltage applying wires 67 are connected toward the inside from the edge part 70 of one blanking aperture array means 6 between the blanking apertures 1A1 and 1A2 of the first stage.

Actually, the wires can be directly connected from the above described edge part to the variable voltage electrodes 65 of the blanking apertures 1A1 and 1A2 and therefore seven wires can be inserted toward the inside between the blanking apertures 1A1 and 1A2.

Branching and integration of such sets of wires are repeated for the following stages up to the final stage, that is, the eighth stage, while the number of wires is reduced in each stage as described above.

The wiring is the same as said wiring structure and is executed from the other edge part 71 of the blanking aperture array means 6.

When connecting the specified wires to the electrodes 60 of the blanking apertures 62 in the blanking aperture array means 6 according to the present invention, the number of blanking apertures 62 is increased and the wiring spaces are limited in the array configuration of the blanking apertures as shown in FIG. 1. Therefore, the number of blanking apertures 62 is limited. In the case of the blanking aperture array configurations as shown in FIGS. 2 and 3, substantially large spaces 73 and 74 can be secured among blanking apertures 62 and an increased number of blanking apertures can be sufficiently accommodated.

In addition, in the embodiment related to the present invention, half of the total number of wires required for connection are connected in a manner as shown in the drawing from both ends of the blanking aperture array means 6 in the stage direction, that is, the end parts 70 and 71 of the blanking aperture array means 6 as shown in FIG. 18. Therefore, the number of wires that are inserted from one end part can be reduced, larger spaces can be reserved and the wiring design will be provided an allowance.

In FIG. 18, the electrodes 60 provided at the blanking apertures 62 are turned on or off independently by the beam ON/OFF signal generator 33 of the blanking aperture array control unit 24. Therefore, the wiring to the electrodes should be formed independent of other wiring.

In FIG. 18, the electrodes 65 are directly connected to the blanking aperture array control units 24, that is, the wiring to the blanking electrodes are shown with dot lines. Specifically, in FIG. 18(A), for example, symbol $l_1$ denotes the wiring to the blanking electrode of the blanking aperture 1A, in the above described aperture stage 1A and similarly, for example, symbols $l_2$, $l_3$ and $l_4$ are respectively the wiring to the blanking electrodes of the blanking aperture $2A_1$ in the aperture stage 2A, the aperture $3A_1$ in the aperture stage 3A and the aperture $4A_1$ in the aperture row 4A. A solid line 68 indicates a common wire 68 for supplying a specified constant voltage, for example, the ground (GND) to the electrodes 66 provided on the other internal surfaces of the blanking apertures 62.

FIG. 18(A) shows the wiring pattern to the electrodes provided at the apertures that belong to the aperture stages 1A and 4B and FIG. 18(B) shows the wiring pattern to the electrodes provided at the apertures that belong to the aperture stages 5A to 8B. Accordingly, in the actual blanking aperture array means 6, upper portion of FIG. 18(B) connects to the bottom portion of FIG. 18(A) as shown in FIG. 19.

FIG. 4 shows an example of main deflection and sub deflection of the charged particle beams, which are irradiated onto the object to be exposed, by the scanning signals supplied to the main deflector 14 and the sub deflector 18, and the Y direction is the stage moving direction.

Figure 4A:
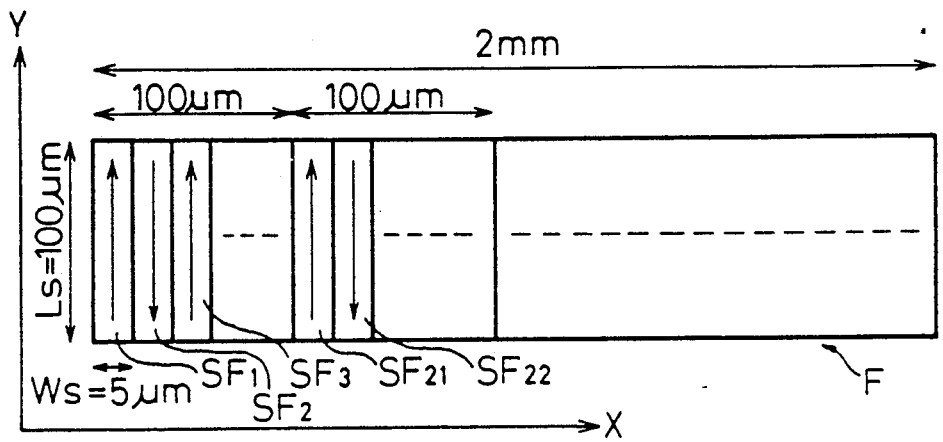
FIGS. 4 (A) and 4 (B) are respectively a diagram of the relationship between an example of main deflection and sub-deflection of the charged particle beams and the direction of the blanking aperture stage of the blanking aperture array means in accordance with the present invention and FIG. 4 (C) is a diagram of the scanning waveforms of charged particle beams in the sub-deflection direction (Y direction).

More specifically, as shown in FIG. 4(A), the sub field region $SF_1$ on the specimen with a width of, for example, 5 μm in the X direction and a length of, for example, 100 μm in the Y direction is raster-scanned with line beams within 5 μsec in the arrow direction in the drawing and subsequently the adjacent sub field region $SF_2$ is raster-scanned at the same speed as above in the reverse direction (the arrow direction in the drawing). Thus, the sub field region with 100 μm width in the X direction and 100 μm length in the Y direction is raster-scanned within a time of 5 μsec×20=100 μsec by sequentially raster-scanning adjacent sub fields $SF_1$, $SF_2$, $SF_3$ ... in the arrow direction in the drawing. The above operation is carried out according to the scanning signal from the sub deflector 18 (sub deflection).

The line beams are moved to the sub field region $SF_{21}$ adjacent to the above sub field region according to the scanning signal from the main deflector 14 (main deflection) and the sub field with 100 μm width in the X direction and 100 μm length in the Y direction is raster-scanned again within 100 μsec by sequentially raster-scanning the sub fields $SF_{21}$, $SF_{22}$, ... in the arrow direction in the drawing the same as the procedure described above. Subsequently, the field region F with a 2 mm scanning width in the X direction and a 100 μm length in the Y direction is raster-scanned within a time of 100 μsec×20=20 msec by similarly repeating the main deflection operation.

Since the field region with a 100 μm length in the Y direction is processed within a time of 2 msec, a field region with a 2 mm scanning width in the X direction and a length of 100 μm×500=50 mm in the Y direction is processed within one second. Therefore, the moving speed of the stage 20 can be 50 mm/sec in the Y direction and the processed area per second is 2 mm×50 mm=1 cm$^2$.

Figure 4B:
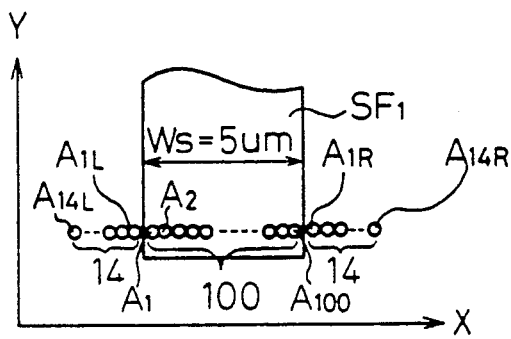

FIG. 4(B) shows an array of line beams in the sub field (for example, $SF_1$) with a 5 μm width (one beam size is 0.05 μm☐ and the beam is circular on the surface) and symbol $A_1$ denotes the beam that passes through an aperture of the first aperture stage (for example, 1A) and symbol $A_2$ is the beam that passes through an aperture of the second aperture stage (for example, 1B). Thus, the sub field region with 5 aμm width is scanned with 100 line beams $A_1$, $A_2$ ... $A_{100}$. The total sum of the apertures of the first aperture stage (for example, 1A) and those of the second aperture stage (for example, 1B) is 128 in the above sample. Accordingly, each 14 line beams $A_{11}$ to $A_{14}$ and $A_{1R}$ to $A_{14R}$ are arrayed beyond the right and left boundaries of the sub field region (for example, $SF_1$). Accordingly, the length of 128 line beams is 6.4 μm.

Figure 4C:
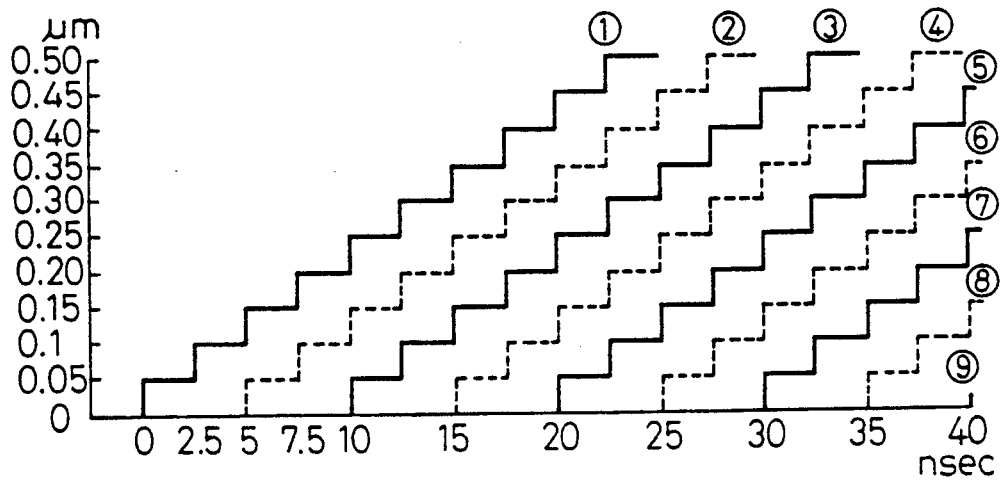

FIG. 4(C) is a diagram showing the scanning waveforms in the Y direction of the above sub deflection; the horizontal axis denotes the time elapsed, and the vertical axis denotes the positions of beams in the Y direction on the surface of the object to be exposed. In FIG. 4(C), ① denotes the position of the beam that has passed through the aperture stage 1B; ② denotes the position of the beam that has passed through the aperture stage 1B; ③ denotes the position of the beam that has passed through the aperture stage 2A, and the following numbers similarly denote the positions of the beams that have passed through the aperture stages. As shown in FIG. 4(C), the charged particle beams that have passed through the aperture stages move as far as 0.05 μm on the surface of the object to be exposed every 2.5 nsec and, after the lapse of 5 nsec, the charged particle beams that have passed through the following aperture stages come up to the same position on the surface of the object to be exposed.

The following describes the principle of the exposure processing method of the object to be exposed by the charged particle beams in the charged particle beam exposure system in accordance with the present invention, referring to the drawings.

Figure 5A:
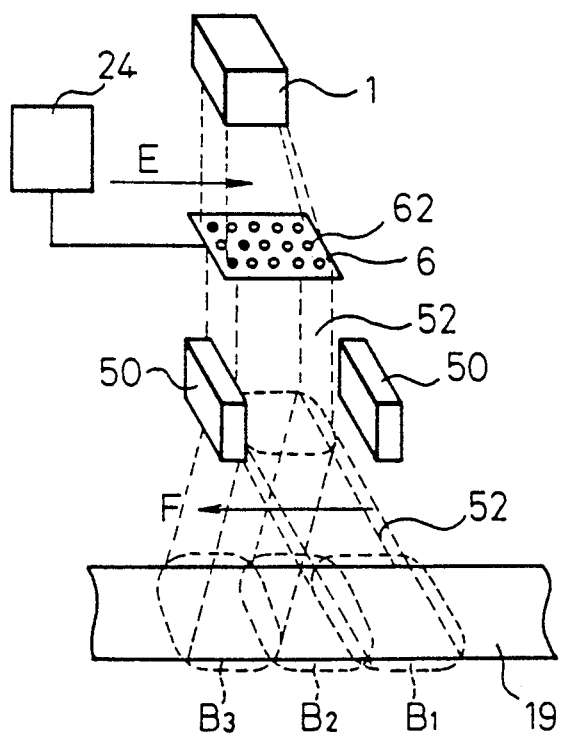
FIG. 5 (A-B) are diagrams illustrating the principle of the exposure method in the charged particle beam exposure system in accordance with the present invention.

FIG. 5(A) briefly shows the principal part of the charged particle beam exposure system in accordance with the present invention.

Charged particle beams 52 emitted from the electron gun 1 pass through the groups of blanking apertures 62 of the blanking aperture array means 6 and are scanned by the electromagnetic deflection means 50 onto the object to be exposed in the direction of arrow F.

On the other hand, in the blanking aperture array means 6, a plurality of blanking apertures 62 are arranged in two dimensions as described above and individually ON/OFF controlled by the blanking aperture array control means 24. The specified pattern 55 is formed on the blanking aperture array means with the blanking apertures 62, which remain in the ON state according to the above described control, and moved in the direction of arrow E according to the control of the blanking aperture array control means 24.

Figure 5B:
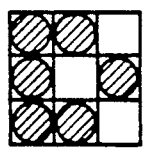
Figure 6A:
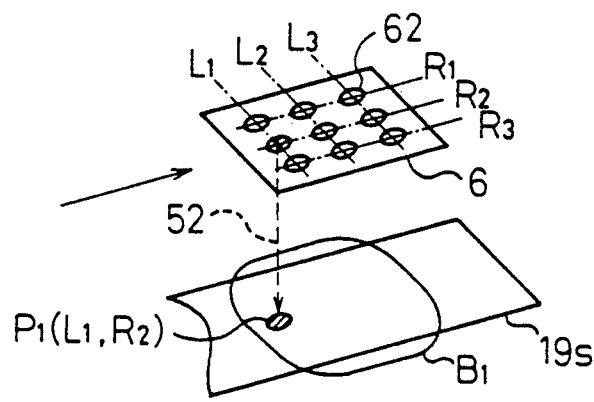
FIG. 6 (A-C) are diagrams illustrating the principle of the exposure method in the charged particle beam exposure system in accordance with the present invention.

In exposure processing of a pattern, as shown in FIG. 5, by the blanking aperture array means 6 in which nine blanking apertures 62 are two-dimensionally arranged in three vertical and horizontal rows (R1, R2 and R3) and three stages (L1, L2 and L3), only the blanking apertures 62 of the central row R2 of the extreme left stage L1 of the blanking aperture array means 6 are turned on at the first process, that is at timing T1 and all other blanking apertures are set to OFF as shown in FIG. 6(A).

Under this condition, the electromagnetic deflection means 50 operates to deflect and irradiate the charged particle beams 52 onto the position B1 near the end part of the sub field 19s on the object to be exposed 19.

Therefore, the charged particle beams 52 irradiate only the position P1 of the object to be exposed 19.

Figure 6B:
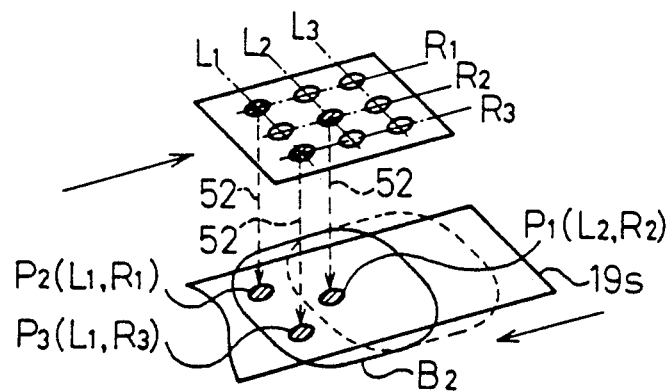

In the second process that is at timing T2, as shown in FIG. 6(B), the pattern is moved slightly to the right, the blanking apertures of the central row R2 of the central stage L2 in the blanking aperture array means 6 are turned on, the blanking apertures of the rows R1 and R3 of the stage L1 are turned on and other blanking apertures are set to OFF.

Under this condition, the electromagnetic deflection means 50 moves the charged particle beams 52 slightly to the left to the position B2 from the irradiating position B1 in the preceding process and the irradiation is executed at this position.

Therefore, the charged particle beams 52 that have passed through the blanking apertures (L2, R2) irradiate again the position P1 of the object 19 to be exposed onto which the charged particle beams are irradiated in the first process and two charged particle beams 52 that have passed through the blanking apertures (L1, R1) and (L1, R3) irradiate positions P2 and P3 of the object to be exposed 19.

In other words, in the present invention, the scanning direction and speed of the charged particle beams 52 and the moving direction and speed of the pattern in the blanking aperture array means 6 are adjusted taking into account the conditions such as the shape of the pattern, the distance between adjacent blanking apertures, etc. to operate all means at the specified timing and exposure by turning on the specified blanking apertures 62 of the blanking aperture array means when the charged particle beams reach a position to be irradiated on the object to be exposed.

In addition, the above described control allows the irradiation of the charged particle beams 52 repeatedly at the same position of the object 19 be exposed.

In this embodiment, the specific position P1 of the object 19 to be exposed is irradiated two times with the charged particle beams, in this step.

Moreover, the specific position P1 of the object to be exposed 19 is to be irradiated with the charged particle beams that have passed through blanking apertures different from the blanking apertures (L1, R2) and (L2, R2) in the blanking aperture array means 6.

Figure 6C:
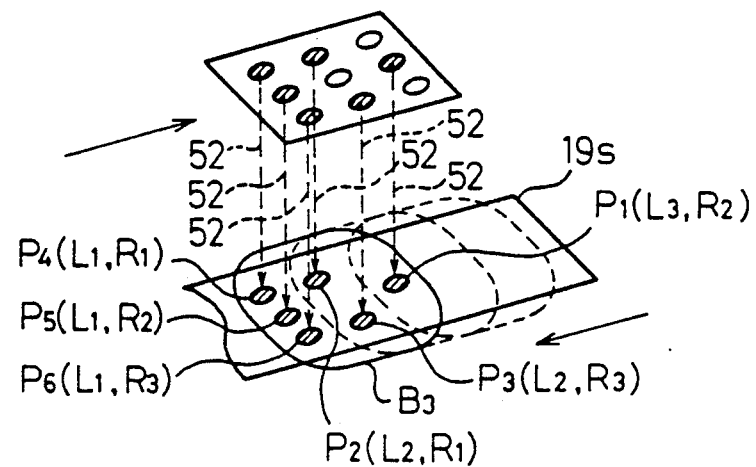

In the third process, that is, at the timing T3, the pattern moves again to the right, and the blanking apertures at the central row R2 of the extreme right stage L3, the blanking apertures at rows R1 and R3 of the central stage L2 and the blanking apertures at rows R1, R2 and R3 of the extreme left stage L1 are turned on as shown in FIG. 6(C).

Under this condition, the electromagnetic means 50 moves the charged particle beams 52 slightly leftward from the irradiating position B2 in the preceding process to the position B3, whereby the irradiation is executed.

Therefore, the charged particle beams 52 that have passed through the blanking apertures (L3, R3) are irradiated again onto the position P1 of the object to be exposed 19, the position of which the charged particle beams were irradiated in the second process. Two charged particle beams 52 that have passed through the blanking apertures (L2, R1) and (L2, R3) are irradiated again onto positions P2 and P3 of the object to be exposed 19, the position of which the charged particle beams were irradiated in the second process. Three charged particle beams 52 that have passed the blanking apertures (L1, R1), (L1, R2) and (L1, R3) are irradiated onto positions P4 to P6 of the object to be exposed 19.

In this embodiment, the specific position P1 of the object to be exposed 19 has received irradiation of charged particle beams three times and the specific positions P2 and P3 have received irradiation of charged particle beams two times in this step.

Any type of pattern can be easily exposed by repeating such processes and all pixels of the pattern are exposed by a plurality of irradiations of the charged particle beams. Depending on the case, all pixels of the pattern need not be irradiated the same number of times and the number of irradiation times with charged particle beams for part of the pixels can be reduced. In the present invention, when the blanking aperture array means 6, which has different phases of blanking apertures as shown in FIGS. 2 and 3, is used, the above described principle also applies. Therefore, a straight line type pattern can be formed by irradiating the charged particle beams that pass through the blanking apertures of the differently phased stages onto the clearances of the blanking apertures of other stages.

More specifically, if the blanking aperture array means 6 as shown, for example, in FIG. 2 is used, a single straight line type pattern can be formed by exposing the clearance portion of a straight intermittently exposed part formed on the object to be exposed 19 by the blanking apertures $1A_1$, $1A_2$, $1A_3$ . . . of the stage 1B to the charged particle beams formed through the blanking apertures $1B_1$, $1B_2$, $1B_3$ . . . of the stage 1B.

In this case, as described above, if the scanning direction and speed of the charged particle beams 52 and the moving direction and speed of the pattern in the blanking aperture array means 6 are adjusted taking into account the conditions such as shape of pattern, distance between blanking apertures 62, etc. to operate all means at a specified timing, the exposure can be executed by operating the control means so that the irradiation is carried out when the charged particle beams that are formed by the blanking apertures $1B_1$, $1B_2$, $1B_3$ . . . of the aperture stage 1B reach the clearance portion of a straight intermittently exposed part formed on the object to be exposed 19 by the blanking apertures $1A_1$, $1A_2$, $1A_3$ . . . of the aperture stage 1A.

In the present invention, the specified position of the object to be exposed 19 is exposed and irradiated a plurality of times by the charged particle beams that have passed through different blanking apertures. Strictly speaking, the same position is rarely irradiated precisely a plurality of times and a slight deviation of the irradiating position of the charged particle beams is unavoidable.

In the present invention, a region including a certain allowance around the predetermined position on the object to be exposed as the center is irradiated by a plurality of charged particle beams.

The above embodiment is described as an example where the stage 20, on which the object to be exposed 19 is mounted, is not moved when the charged particle beams are irradiated for exposure, that is, as the step and repeat system. In the present invention, a continuous moving system by which the scanning of the charged particle beams and the stage at the same time can be performed. In this case, a complex control system is required.

FIG. 16 shows a process of exposure of a predetermined pattern using the blanking aperture array in another embodiment of the present invention. In FIG. 16, in order to simplify the disclosure, the process is illustrated in FIG. 16(C) to draw the pattern as shown in FIG. 16(B) only by the charged particle beam passing through one group of apertures constituted by the first aperture row (as row A, and including three apertures 1, 3 and 5) and the second aperture row (as row B, and including two apertures 2 and 4). Here, assuming that the respective apertures 1, 3 and 5 of the first aperture row offset the above-mentioned pitch 2S in a direction perpendicular to the scanning direction, the respective apertures 2 and 4 of the second aperture row are offset relative to respective apertures 1, 2 and 3 of the first aperture row in a magnitude of pitch S.

Here, the raster scanning speed in Y direction is 100 $\mu$m/5 $\mu$sec=0.05 $\mu$m/2.5 nsec. Accordingly, relative to the ON/OFF signal applied to the braking electrodes provided in respective apertures in the row A, the ON/OFF signal applied to the blanking electrodes in a respective aperture in the row B should be delayed to satisfy TAB=L/V (V is the raster scanning speed), when the distance between the rows A and B in the scanning direction is L. Since L=0.1 $\mu$m, V=0.05 $\mu$m/2.5 nsec, in the shown example, TAB becomes 5 nsec. Thus, when the sample is placed at the predetermined position, a raster scan is performed to irradiate the beam to the predetermined position.

Namely, as shown in FIG. 16(C), at first, at a time T=1 (here, time T takes a unit to advance the raster scan in a magnitude of 0.05 $\mu$m, and therefore 2.5 nsec in the foregoing example), the lower most two regions (the region with single direction hatching) in the drawing pattern are irradiated by the charged particle beam passing the apertures 1 and 3 of the row A. Next, at T=2, (2.5 nsec later), the three regions (the region with single direction hatching) immediately above the lower most region are irradiated by the charged particle beam passing through the apertures 1, 3 and 5. It should be noted that the region illustrated with cross hatching at the lowermost region represents the region that has already been irradiated in the preceding period (i.e., T=1).

In the similar manner, at T=3, the next two regions (the regions with the single direction hatching) are irradiated by the charged particle beam passing through the aperture 1 and 3, at T=4, the next three regions (the regions with the single direction hatching) by the charged particle beam passing through the apertures 1, 3 and 5, and subsequently, at T=5, the next two regions (the region with the single direction hatching) are irradiated by the charged particle beam passing through the apertures 1 and 5, at the same time; the remaining two regions in the same row of the regions irradiated by the charged particle beam at the time T=3 are irradiated by the charged particle beam passing through the apertures 2 and 4 of the row B.

In a similar manner, at T=8, all of the pattern regions (even in a direction perpendicular to the scanning direction) are irradiated by the charged particle beam passing through respective apertures. As set forth, in FIG. 16(C), the regions illustrated with single direction hatching are the regions currently irradiated by the charged particle beam and the regions illustrated with the cross hatching are the regions already irradiated in the preceding periods. Also, FIG. 16(C) also shows shifting of the reference line shown as Line Y0 in FIG. 16(A) on the sample according to a shifting of the position of the raster scan.

Here, in the blanking aperture array according to the present invention, as set forth above, a plurality of groups (8 groups in the foregoing example) of apertures are aligned in the scanning direction of the charged particle beam (namely, arranging the blanking aperture groups in several rows, e.g., 8 columns in scanning direction, in the scanning direction), so that the same exposure of the same region on the object to be exposed within the same scanning timing with a timing delay. Namely, in the above-mentioned example, exposure is performed 8 times.

Namely, in the case that it takes 20 nsec for exposure of the specific point on the resist (i.e., exposure time of the resist is 20 nsec), and when the scanning speed per 0.05 $\mu$m is 2.5 nsec, the exposure time of 2.5 nsec $\times$ 8 = 20 nsec can be obtained by a total of 8 shots of beam irradiation by an irradiating beam when each of the blanking apertures of the 8 rows passes over the corresponding position.

On the other hand, when re-focusing is performed upon exposure of the charged particle beam with the blanking aperture array according to the present invention, and at the transition from the region to be completely exposed in the overall area to the region having no area to be exposed, if the pitch (corresponding to distance a of FIG. 2) between the specific aperture columns (for example, 1A and 2A of the first aperture column) in each aperture group is 0.2 $\mu$m on the surface of the object to be exposed, the re-focus current can vary within a period corresponding to the period, in which the raster scan is advanced for a distance of 0.2 $\mu$m $\times$ 8 = 1.6 $\mu$m (corresponding to the distance b of FIG. 2).

Accordingly, as set forth above, when the scanning speed of the beam is 0.05 $\mu$m/2.5 nsec, the re-focusing current can be adjusted from approximately 0A to the maximum value (the re-focusing current when all beams passing through respective aperture of the blanking aperture array become ON, e.g., 1A) over a period of 2.5 nsec $\times$ 1,6/0.05 = 2.5 nsec $\times$ 32 = 80 nsec. This can be easily done by an analog current driving type amplifier.

Figure 8:
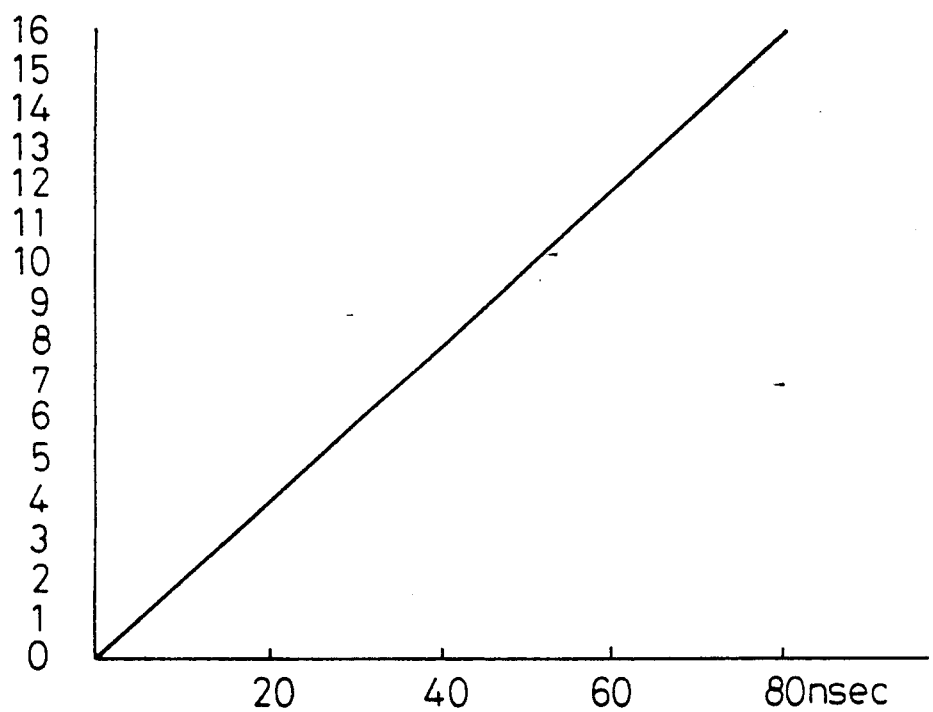
FIG. 8 is a diagram of the output current waveforms supplied to the refocus coil.

FIG. 8 shows a rising waveform of an output current (the output current of the above-mentioned analog current driving type amplifier) supplied to the re-focusing coil when exposure of the charged particle beam employs the braking aperture arrangement of the present invention, and in which is illustrated a variation from the minimum value to the maximum value over 80 nsec. It should be noted that, in FIG. 8, the vertical axis indicates the number of aperture columns through which the beam of raster scan passes, and in the shown example, sixteen aperture columns of 1A to 8B are provided.

As set forth above, according to the present invention, the number of beams in ON state is increased so that even when the value of the beam current becomes large, the charged particle beam 8 can be accurately focused on the surface of the sample 19 by supplying the predetermined re-focusing current to the re-focusing coil, as shown in FIG. 7(C). At this time, the deflecting position error (the error in the lateral direction as shown by broken line in FIG. 7(C) can be compensated by supplying the deflection signal proportional to the number of beams in an ON state for the sub-deflector 18 via a re-focusing flyback 35.

On the other hand, when the blanking aperture array according to the present invention is employed, since the region of 0.05 μm□, for example, is exposed 8 times by the beam shots, the exposure amount can be reduced for ⅛ of the necessary exposure amount for reducing one beam shot. This can be advantageously applied to the applications shown in FIGS. 9 to 11.

Figure 9A:
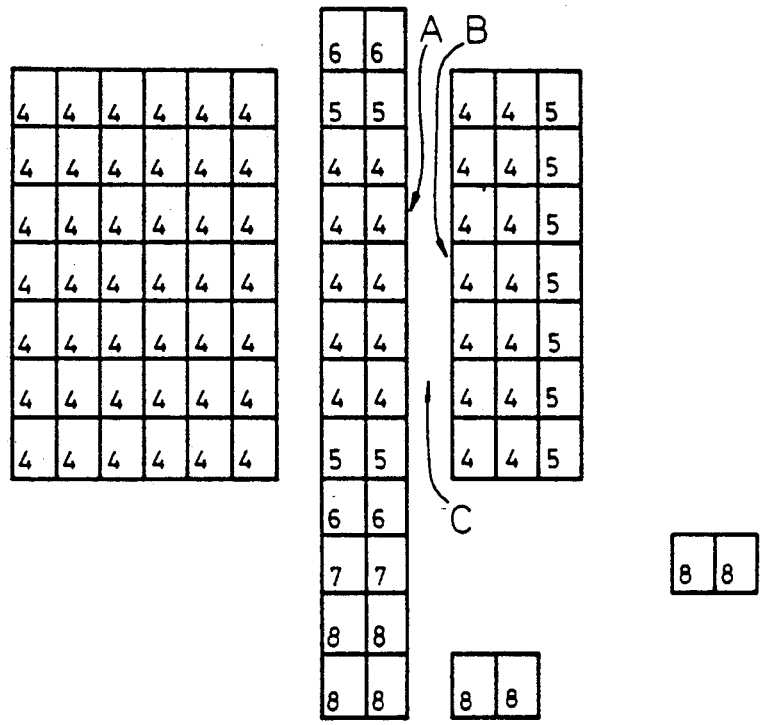
FIG. 9 (A-B) are diagrams of an example of a proximity effect correction by the exposure method in accordance with the present invention.

FIG. 9(A) shows one example for the correction of proximity effect (phenomenon causing fogging of the energy in the region adjacent to the region having a high exposure amount due to reflection of the irradiated charged particle beam from the inside of the substrate to the resist). The figures shown in respective irradiating regions represents the number of shots of the charged particle beam (same in FIGS. 9 through 11). As shown in FIG. 9(A), by reducing the overall exposure amount for the large pattern, even when the patterns A and B are located close to each other, no fogging of the irradiated energy occurs in the intermediate region C. Therefore, adjoining of the patterns A and B via the intermediate region C can be eliminated.

Figure 9B:
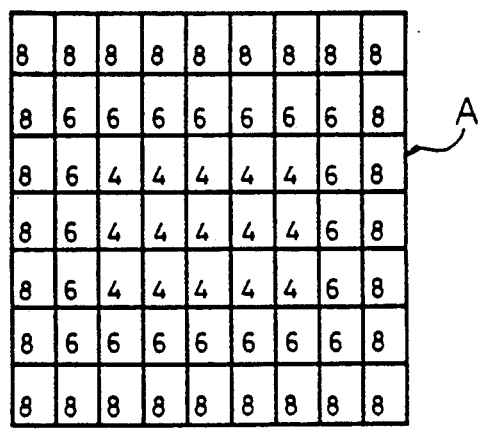

FIG. 9(B) shows another example of a correction of the proximity effect by the exposure method according to the present invention. As shown, by reducing the exposure amount of the large pattern A other than the circumferential region thereof, the affect of the proximity effect can be reduced to make the outline of the pattern clear.

Figures 10A, 10B:
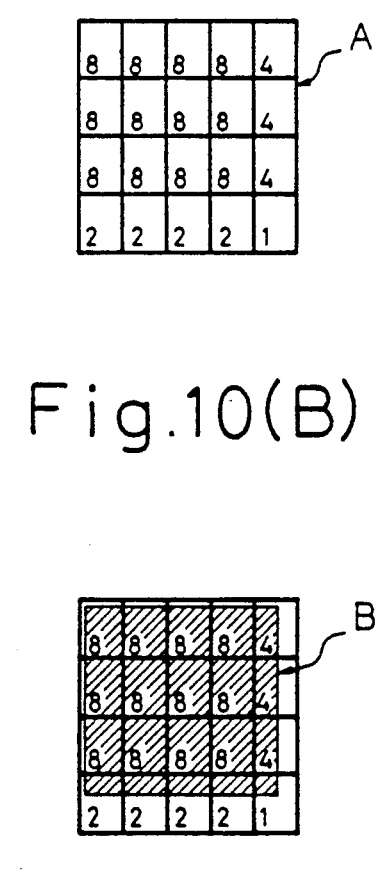

FIG. 10 shows an example, in which the exposure pattern shifts at a magnitude smaller than the beam size. By setting the number of shots for respective regions as shown in FIG. 10(A), the exposure for the hatched region B as shown in FIG. 10(B) becomes possible. With this method, when the beam size is 0.05 μm□, the pattern having a smaller designated dimension can be exposed.

FIG. 11 shows an example of exposure for the joint between fields or sub-fields employing the exposure method according to the present invention. It is assumed that the desired exposure pattern extends from A sub-field to B sub-field across the border therebetween, as shown in FIG. 11(A).

Figure 11A:
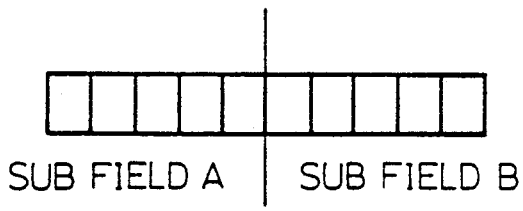
FIG. 11 (A-D) are diagrams illustrating the steps of exposing the stitch of the fields or the sub-fields by the exposure method of the present invention.
Figure 11B:
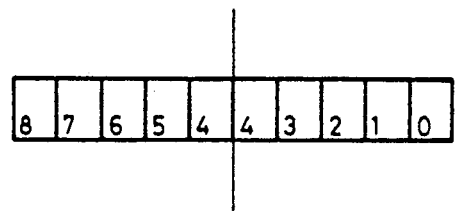
Figure 11C:
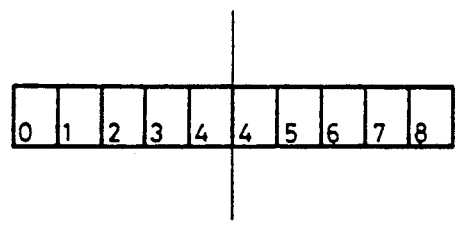

In this case, when the A sub-field is exposed, an exposure is performed with a number of shots as shown in FIG. 11(B). In this case, the five regions extending into the B sub-field are exposed for the number of shots indicated in FIG. 11(B) by five line means A1R to A5R among fourteen line beams A1R to A14R, which extend right across the border of the sub-field, as shown in FIG. 4(B). Next, when the B sub-field is to be exposed, respective regions are exposed in the number of shots as indicated in FIG. 11(C). In this case, the five regions extending into the A sub-field are exposed for the number of shots as indicated in FIG. 11(C) by the five line beams A1L to A5L among fourteen line beams A1L to A14L extending left across the border. As a result, the number of shots of beams for all regions in the pattern shown in FIG. 11(A) becomes 8.

Figure 11D:

FIG. 11(D) shows the exposure pattern when the image from respective sub-fields are slightly offset from each other. It is assumed that A represents the drawing pattern from the A sub-field and B represents the drawing pattern from the B sub-field. The drawing pattern formed by combining these two patterns is represented by C. By this, the pattern that is substantially continuous at the joint in comparison with that drawn independently from respective sub-fields, can be drawn. As set forth above, by lowering the exposure amount at the border region of the fields or sub-fields and by performing an exposure in an overlapping manner for the fields or sub-fields so that the same positions can be exposed from respective adjacent fields or sub-fields, the joint between adjacent fields or sub-fields can be smoothly connected.

The following table 1 shows practical values of various data when exposure of the charged particle beam is performed employing the method according to the present invention.

TABLE 1

| | | | |
|---|---|---|---|
| 1 | Beam Size | | 0.05 μm□ |
| 2 | Current Density | | 250 A/cm$^2$ |
| 3 | Beam Current | | 6.25 mA |
| 4 | Number of Beam in BAA | X direction | 128 × 8 = 1024 |
| 5 | Total Beam Current | | 6.4 μA |
| 6 | Beam Convergence Half Angle | | 10 mrad |
| 7 | Electron Bean Luminance | | 10$^6$ A/cm$^2$ sterad |
| 8 | Process Amount | | 1 cm$^2$/sec |
| 9 | Stage Shift | Y direction | 50 mm/sec |
| 10 | Main Deflector | X direction | 2 mm/2 msec |
| 11 | Sub-Deflector | Y direction | 5 × 100 μm$^2$/5 μsec |
| 12 | Scan | Y direction | 100 μm/5 μsec 0.05 μm/2.5 nsec 2.5 nsec/1 shot |
| 13 | Resist Sensitivity, Exposure Time | | 5 μC/cm$^2$ 20 nsec 8 shots |
| 14 | Re-Focusing Time | | 80 nsec |

As shown in the foregoing table, the beam size at the surface of the sample is set to be 0.05 μm□. On the other hand, the current density is set to be 250 A/cm$^2$. On the other hand, the current value of a single beam becomes 6.26 nA.

The number of beams in the blanking aperture array is, since the number of apertures in each aperture group (for example, formed by the first aperture column 1A and the second aperture column 1B) is 128, 128×8=1024, in total. Also, the total beam current is 6.25 nA×1024=6.4 μA. On the other hand, the beam convergence half angle α (see FIG. 12) becomes 10 mmrad, and the luminance β of the electron beam becomes 10$^6$ A/cm$^2$ sterad.

Next, since the process is performed in the stage shifting direction at a speed of 50 mm/sec with the scanning width of 2 mm, the process amount becomes 1 cm$^2$/sec. The stage shifting speed is set to be 50 mm/sec in Y direction. The main deflection is 2 mm/2 msec in X direction and the sub deflection is 5 μm×100 μm/5 μsec in Y direction.

Furthermore, the scanning speed becomes 100 μm/5 μsec=0.05 μm/2.5 nsec. Since the beam size is 0.05 μm□, the beam staying period per one shot becomes 2.5 nsec. Setting the resist sensitivity at 5 $\mu C/cm^2$, the exposure time is derived to be 20 nsec by dividing the resist sensitivity by the current density of the beam. Accordingly, by irradiating 8 times a sufficient exposure time can be obtained. The re-focus time (allowed period for increasing the re-focusing current from the minimum value to the maximum value) is 80 nsec, as set forth above.

According to the present invention, even when the number of charged particle beams is increased, re-focusing for compensating focus error due to Coulomb interaction can be facilitated to allow the formation of a sharp pattern. Also, even when a plurality of aperture groups are formed, the wiring for respective electrodes on the blanking aperture array becomes easy. Furthermore, the present invention allows a substantially high density exposure with no gaps between irradiated points.

Further in accordance with the charged particle electron beams exposing method of the present invention, the basic method thereof is completely different from that of U.S. Pat. No. 4,153,843 in that the exposure operation is carried out in such a way that the charged particle electron beams expose all of the predetermined exposure region simultaneously therein by utilizing a blanking aperture array in which all of the apertures are arranged two dimensional and all of the apertures formed in the aperture array are used simultaneously.

Therefore, in the present invention, an inner diameter of the blanking aperture and a pitch thereof can be set previously at a suitable dimension respectively, so that all of the exposed positions formed on the sample to be exposed are in contact with each other and thus, a plurality of the beams can be controlled easily without creating defecting portions as shown in the conventional technology.

In the present invention, since each one of a plurality of beams are exposed on the respective addressed position and, each of them being adjacent to each other, both the aberration and the reduction ratio of all the beams can be controlled at the same level.

And further, in the present invention, since the interleave method is not adopted, the controlling circuit of the charged particle electron beams is simplified.

On the other hand, in the present invention, since the charged particle electron beams are simultaneously exposed on the plurality of addressed positions adjacently arranged on the sample to be exposed, all of the addressed positions formed on the sample can be exposed with approximately the same conditions when the addressed positions are exposed with the beam each having the same intensity.

We claim:

1. A charged particle beam exposure system comprising:
    a charged particle beam generating means for generating a charged particle beam;
    a blanking aperture array means for shaping said charged particle beam generated by said charged particle beam generating means and having a plurality of blanking apertures arranged in two dimensional form;
    a stage means for holding an object to be exposed;
    a deflection means for deflecting the charged particle beam passing through said blanking aperture array means by a specified amount in order to irradiate the charged particle beams onto the specified position of said object to be exposed;
    wherein said system further comprising;
    a first means for irradiating a pattern formed by said charged particle beams arranged in two dimensional configuration on a first region specified on said object to be exposed;
    a second means for successively irradiating the pattern formed by said charged particle beams arranged in two dimensional configuration on a second region having an overlapping region to the first region;
    and wherein said first and second means are constructed so that when said charged particle beams are irradiated to said object to be exposed, a first charged particle beam passing through a first blanking aperture irradiates a specified first region on said object to be exposed by said first means and a second charged particle beam passing through a second blanking aperture arranged next to said first blanking aperture irradiates a region closely arranged to said specified first region by said second means, and thus said specified position in said overlapping region is irradiated a plurality of times by respective charged particle beams, each having a certain irradiation amount set by, dividing a total irradiation amount.

2. A charged particle beam exposure system according to claim 1, wherein assuming that the width of each of said blanking apertures in the row direction is S and the number of blanking aperture columns having different arrangement phases is n, the distance of each blanking aperture in adjacent blanking aperture columns, in a row direction, is set to be nS or a value approximate to nS.

3. A charged particle beam exposure system according to claim 1, wherein the total width of each blanking aperture forming said blanking aperture array, in the row direction is at least equal to the width of a sub-field to scan said charged particle beam.

4. A charged particle beam exposure system according to claim 1, wherein, in said blanking aperture array, a plurality of blanking apertures forming one column has a different arrangement phase to a plurality of blanking apertures forming an adjacent column.

5. A charged particle beam exposure system according to claim 1, wherein a plurality of columns having different arrangement phases of a plurality of blanking apertures are formed into one unit, and a plurality of units are repeated.

6. A charged particle beam exposure system according to claim 1, wherein respective charged particle beams passing through the blanking aperture group formed by a plurality of blanking aperture columns mutually having different arrangement phases, are positioned on the same row line of the irradiation exposure section formed on said object and is controlled by said control means so as to be irradiated between said irradiation exposure sections.

7. A charged particle beam exposure system according to claim 1, wherein electrode means is provided for each blanking aperture of said blanking aperture array, which can be set at ON state to pass said charged particle beams generated by said charged particle beam generating means to reach said object and at OFF state to deflect said charged particle beam upon passing through said blanking aperture so as not to reach said object; said electrode means being selectively set at ON and OFF state depending upon the presence and absence of a predetermined voltage by said blanking aperture array control means.

8. A charged particle beam exposure system according to claim 7, wherein said electrode means comprises two mutually independent electrode sections provided in the vicinity of two opposing surfaces of said blanking aperture, and one of said electrode section forming a variable voltage electrode connected to said blanking aperture array control means and the other forming a constant voltage electrode connected to a constant voltage source.

9. A charged particle beam exposure system comprising:
a charged particle beam generating means for generating a charged particle beam;
a blanking aperture array means for shaping said charged particle beam generated by said charged particle beam generating means and having a plurality of blanking apertures arranged in two dimensional configuration;
a stage means for holding an object to be exposed;
a deflection means for deflecting the charged particle beam passing through said blanking aperture array means by a specified amount in order to irradiate the charged particle beams onto the specified position of said object to be exposed;
a control means for controlling at least one of said means; and
wherein said blanking aperture array means having a plurality of blanking apertures arranged in two dimensional configuration, and said control means including a control means for controlling said blanking aperture array means;
and wherein said blanking aperture array controlling means independently controls respective blanking aperture to continuously form a pattern to be exposed to a specific position of said object to be exposed so as to set the blanking aperture to ON state where the charged particle beams generated by said charged particle beam generating means pass through the blanking aperture and reach the object to be exposed or the OFF state where the charged particle beams cannot reach the object to be exposed and thereby a plurality of said charged particle beams irradiate a predetermined position on said object to be exposed, respectively, so that a pattern exposed on said position formed by one of said charged particle beams contacts another pattern thereof formed by another charged particle beam without being separated from each other, and further said blanking aperture array controlling means controlling said blanking apertures to move a predetermined pattern to be exposed on said object to be exposed in a predetermined direction along said blanking aperture array means, and when the pattern is moved, to irradiate a plurality of said charged particle beams passing through a plurality of blanking apertures newly selected to form a predetermined pattern at a region that overlaps with said predetermined region to which a plurality of said charged particle beams passing through a plurality of blanking apertures previously selected to form said predetermined pattern, are irradiated.

10. A charged particle beam exposure system according to claim 9, wherein said specific region of said object to be exposed is exposed to the predetermined pattern by scanning the charged particle beam utilizing said deflection means and in synchronism with deflecting scan of said deflection means, said blanking aperture array control means controls shifting of said specific pattern formed in said blanking aperture array in one direction so that said overlapping region comprising, the specific position or the position in the vicinity of said specific position in said specific region of said object can be irradiated in an overlapping manner with a given time interval with a plurality of said charged particle beams passing through different blanking apertures.

11. A charged particle beam exposure system according to claim 9, wherein a plurality of said blanking apertures in said blanking aperture array have the same opening areas and arranged in a plurality of rows and a plurality of columns to form a matrix form array.

12. A charged particle beam exposure system according to claim 9, wherein wiring is provided utilizing a space extending from both column direction ends of said blanking array to the clearance between rows of said blanking apertures toward the inside of a control signal line from said blanking aperture array control means and connects said control signal line to respective variable voltage electrodes of respective blanking aperture, and said constant voltage source wiring is arranged in the vicinity of the center of said blanking to aperture array connect said constant voltage source wiring to said constant voltage electrodes of respective blanking apertures.

13. A blanking aperture array means which includes a plurality of blanking apertures having the same opening, wherein said apertures are classified into a first blanking aperture array group in which a plurality of said blanking apertures are arranged both in row direction and column direction to form a matrix array configuration and a second blanking aperture array group in which a plurality of said blanking apertures are arranged both in row direction and column direction to form a matrix array configuration and wherein in the column direction, one row of the blanking apertures in said first blanking aperture array group and one row of the blanking apertures in said second blanking aperture array group being alternately arranged each other, while in said row direction, one blanking aperture in said first blanking aperture array group is arranged in a portion opposite to a space formed between adjacent two blanking apertures in the row direction in said second blanking aperture array group, and wherein a pitch length in said row direction formed between one blanking aperture of said first blanking aperture array group and one blanking aperture of said second blanking aperture array group, is set at a predetermined value so that when two different charged particle beams passed through two adjacently arranged blanking apertures, each of which belonging to one of said first and second blanking aperture array groups, respectively, are irradiated the object to be exposed, each of portions exposed with said each one of said different charged particle beams, respectively, is connected to each other on said object.

14. A blanking aperture array means as set forth in claim 13, wherein, in said blanking aperture array means, a plurality of blanking apertures forming one column have different arrangement phases to a plurality of blanking apertures forming an adjacent column.

15. A blanking aperture array means as set forth in claim 14, wherein, assuming that the width of each of said blanking apertures in the row direction is S and the number of blanking aperture columns having different arrangement phases in n, the distance of each blanking aperture in adjacent blanking aperture columns, in the row direction, is set to be nS or a value approximate to nS.

16. A blanking aperture array means as set forth in claim 14, wherein a plurality of columns having different arrangement phases of a plurality of blanking apertures are formed into one unit, and a plurality of units are repeated.

17. A blanking aperture array means as set forth in claim 13, wherein the total a width of each blanking aperture forming said blanking aperture array means, in the row direction, is at least equal to the width of a sub-field to scan said charged particle beams.

18. A method for exposing an object by a charged particle beam exposure system having means for generating a charged particle beam, a blanking aperture array comprising a plurality of selectively and individually controllable blanking apertures arranged in a two-dimensional configuration of parallel rows and transverse, parallel columns, and means for repeatedly scanning the blanking aperture array with the beam and for selectively controlling and thereby enabling the individual apertures thereof thereby to permit the scanning beam to pass through the individual, selectively enabled apertures of the array, means for holding an object to be exposed and deflecting means for deflecting the beam, after passing through a selectively enabled aperture of the array, to scan the object in a corresponding position thereon, said method comprising:
defining potential target positions to be exposed on the object, the target positions arranged in a two-dimensional configuration of parallel rows and transverse, parallel columns corresponding to the two-dimensional configuration of the apertures of the blanking aperture array;
moving the object, as held by the holding means, relative to the blanking aperture array and in a first direction parallel to the respective columns of the blanking aperture array and of the target positions;
in a first step, scanning an array to expose a desired pattern of first target positions in a first row on the object with the beam in accordance with selectively enabling the corresponding apertures of the first row of apertures of the array;
in a second step, moving the object relative to the array in the first direction and so as to position the first row of potential target positions on the object in correspondence with a second, next successive row of apertures of the array and thereby to position a second row of potential target positions on the object with the first row of apertures of the array, and selectively and individual enabling the apertures of the second row of the array in accordance with the desired pattern of the first target positions of the first row on the object and, simultaneously, selectively and individually enabling the apertures of the first row of the array in accordance with a desired pattern of second target positions in a second row on the object, and scanning the array with the beam so as to expose the desired pattern of first target positions in the first row and second target positions in the second row on the object with the beam, in accordance with the selectively enabled and corresponding apertures of the respective, second and first rows of apertures of the array; and performing the successive steps until each row of the target positions on the object has been exposed by the scanning beam through the correspondingly enabled apertures, in succession, for each row of apertures of the array.

19. The method for exposing an object by charge particle beam exposure system as recited in claim 18, wherein the blanking apertures of the blanking aperture array have the same dimensions.

20. The method for exposing an object by a charge particle beam exposure system as recited in claim 18, wherein the deflecting means comprising a sub-field having a width which is equal to or less than the total width of each blanking aperture forming the blanking aperture array in the row direction.

21. A method for exposing a charged particle beam to an object to be exposed according to claim 18, wherein:
the deflection means comprises a lens means,
and the control means calculates the total sum of the number of the blanking apertures in the blanking aperture array to be selectively controlled to irradiate a target position and the lens means, simultaneously, compensating the focus error due to the Coulomb effect of the charged particle beams by means of a refocusing means.

22. A method for exposing a charged particle beam to an object to be exposed according to claim 18, wherein the control means calculates the total sum of a number of blanking apertures in the blanking aperture array to be selectively controlled to irrigate a target position and simultaneously, the deflection means applies a deflection signal to deflect the charged particle beam to compensate and offset the position of the beam from an intended position thereof.

23. A method for exposing an object by a charged particle beam exposure system having means for generating a charged particle beam, a blanking aperture array comprising a plurality of selectively and individually controllable blanking apertures arranged in a two-dimensional configuration of parallel rows and transverse, parallel columns, and means for repeatedly scanning the blanking aperture array with the beam and for selectively controlling and thereby enabling the individual apertures thereof thereby to permit the scanning beam to pass through the individual, selectively enabled apertures of the array, means for holding an object to be exposed and deflecting means for deflecting the beam, after passing through a selectively enabled aperture of the array, to scan the object in a corresponding position thereon, said method comprising:
defining potential target positions to be exposed on the object, the target positions arranged in a two-dimensional configuration of parallel rows and transverse, parallel columns corresponding to the two-dimensional configuration of the apertures of the blanking aperture array;
moving the object, as held by the holding means, relative to the blanking aperture array and in a first direction parallel to the respective columns of the blanking aperture array and of the target positions;
in a first step, scanning an array to expose a desired pattern of first target positions in a first row on the object with the beam in accordance with selectively enabling the corresponding apertures of the first row of apertures of the array;
in a second step, moving the object relative to the array in the first direction and so as to position the first row of potential target position on the object in correspondence with a second, next successive row of apertures of the array and thereby to position a second row of potential target positions on the object with the first row of apertures of the array, and selectively and individually enabling the apertures of the second row of the array in accordance with a desired pattern of peripheral positions in the vicinity of the first target positions of the first row on the object and, simultaneously, selectively and individually enabling the apertures of the first row of the array in accordance with a desired pattern of second target positions in a second row on the object, and scanning the array with the beam so as to expose the desired pattern peripheral positions in the vicinity of first target positions in the first row and second target positions in the second row on the object with the beam, in accordance with the selectively enabled and corresponding apertures of the respective, second and first rows of apertures of the array; and performing the successive steps until each row of the target positions on the object has been exposed by the scanning beam through the correspondingly enabled apertures, in succession, for each row of apertures of the array.

24. The method for exposing an object by charge particle beam exposure system as recited in claim 23, wherein the blanking apertures of the blanking aperture array have the same dimensions.

25. The method for exposing an object by a charge particle beam exposure system as recited in claim 23, wherein the deflecting means comprising a sub-field having a width which is equal to or less than the total width of each blanking aperture forming the blanking aperture array in the row direction.

26. A method for exposing an object by a charged particle beam exposure system having means for generating a charged particle beam, a blanking aperture array comprising a plurality of selectively and individually controllable blanking apertures arranged in a two-dimensional configuration of parallel rows and N groups of transverse, parallel columns, wherein N is an integer and the blanking apertures in each column of a group have a width of S in the row direction and the distance of each blank aperture in adjacent blanking aperture rows is approximately NS, and means for repeatedly scanning the blanking aperture array with the beam and for selectively controlling and thereby enabling the individual apertures thereof thereby to permit the scanning beam to pass through the individual, selectively enabled apertures of the array, means for holding an object to be exposed and deflecting means for deflecting the beam, after passing through a selectively enabled aperture of the array, to scan the object in a corresponding position thereon, said method comprising:

defining potential target positions to be exposed on the object, the target positions arranged in a two-dimensional configuration of parallel rows and N groups of transverse, parallel columns corresponding to the two-dimensional configuration of the apertures of the blanking aperture array;

moving the object, as held by the holding means, relative to the blanking aperture array and in a first direction parallel to the respective columns of the blanking aperture array and of the target positions;

in a first step, scanning an array to expose a desired pattern of first target positions in a first row on the object with the beam in accordance with selectively enabling the corresponding apertures of the first row of apertures of the array;

in a second step, moving the object relative to the array in the first direction and so as to position the first row of potential target positions on the object in correspondence with a second next successive row of apertures of the array and thereby to position a second row of potential target positions on the object with the first row of apertures of the array, and selectively and individually enabling the apertures of the second row of the array in accordance with a desired pattern of third target positions in the first row on the object and, simultaneously, selectively and individually enabling the apertures of the first row of the array in accordance with a desired pattern of second target positions in the second row on the object, and scanning the array with the beam so as to expose the desired pattern of third target positions in the first row and second target positions in the second row on the object with the beam, in accordance with the selectively enabled and corresponding apertures of the respective, second and first rows of apertures of the array; and performing the successive steps until each row of the target positions on the object has been exposed by the scanning beam through the correspondingly enabled apertures, in succession, for each row of apertures of the array.

27. The method for exposing an object by charge particle beam exposure system as recited in claim 26, wherein the blanking apertures of the blanking aperture array have the same dimensions.

28. The method for exposing an object by a charge particle beam exposure system as recited in claim 26, wherein the deflecting means comprising a sub-field having a width which is equal to or less than the total width of each blanking aperture forming the blanking aperture array in the row direction.

29. A method for exposing a charge particle beam to an object to be exposed according to claim 26, wherein the beam irradiation intensity of the pattern to be exposed on the surface of the object is selected as an integer from 1 to N, and the integers of the irradiation intensity are selected so that the beam irradiation intensity at the inside of the pattern is lower than that of the circumferential portion of the pattern.

30. A method for exposing a charged particle beam to an object to be exposed according to claim 26, wherein the beam irradiation intensity of the pattern to be exposed on the surface of the object is selected as an integer from 1 to N, and the region outside of the pattern to be exposed at the integer value of N, is exposed by the lower irradiation intensity to form a smaller pattern than the pattern.

31. A method for exposing an object by a charged particle beam exposure system having means for generating a charged particle beam, a blanking aperture array comprising a plurality of selectively and individually controllable blanking apertures arranged in a two-dimensional configuration of parallel rows and transverse, parallel columns, and means for repeatedly scanning the blanking aperture array with the beam and for selectively controlling and thereby enabling the individual apertures thereof thereby to permit the scanning beam to pass through the individual, selectively enabled apertures of the array, means for holding an object to be exposed and deflecting means for deflecting the beam, after passing through a selectively enabled aperture of the array, to scan the object in a corresponding target position thereon, said method comprising:

defining the respective positions of the blanking apertures within the blanking aperture array in accordance with the two-dimensional configuration of parallel rows and transverse, parallel columns, the columns being grouped in parallel stages and each stage comprising a common number of plural columns including a first and successive columns, the respectively corresponding apertures of the successive columns of each of the plurality of stages being successively spaced and off-set in the column direction and the respective blanking apertures of the respective, first and successive columns of each of the plural stages being aligned in respective rows of a row alignment pattern, the row alignment pattern thereby including plural sets, each set comprising a number of first and successive alignment rows equal to the common number of the columns of apertures in each of the plural stages;

defining potential target positions to be exposed on the object, the target positions being arranged in a two-dimensional configuration of parallel rows and transverse, parallel columns corresponding to the two-dimensional configuration of the array and including plural, adjacent target positions in each of plural columns and arranged in respectively corresponding target position rows, the rows being grouped in plural sets, each set of plural rows, the plural sets of target position rows respectively corresponding the plural sets of blanking aperture alignment rows and the first and successive target position alignment rows of each set respectively corresponding to the respective blanking apertures of the first and successive columns of blanking apertures of each stage thereof, of the array;

moving the object relative to the blanking aperture array in a succession of steps, each step including a set of plural substeps comprising a first and successive substeps, equal in number to the number of first and successive columns in each stage of plural columns of the blanking aperture array, and thereby in a first step and associated first substep, scanning the blanking aperture array with the beam to expose a desired pattern of first target positions in the corresponding first row alignment position of the plural sets thereof and in a first column of target positions on the object, in accordance with selectively enabling the corresponding apertures of the first alignment row of apertures of the first column thereof, of the blanking aperture array;

in a second subset of the first step, moving the object relative to the array in the first direction and so as to position the second alignment row, of each of the plural sets thereof, of potential target positions of the first column thereof on the object with the respective blanking apertures of the second columns of the first stage and of the second alignment rows of the sets thereof of the array, and selectively individually enabling the aligned blanking apertures the array in accordance with the desired pattern of the first target positions of the first row of the object, and repeating the second substep for each of the successive columns and alignment rows of the first stage of the array;

in each of second and successive steps and, for each step, in each of the associated first and successive substeps, moving the object relative to the array in the first direction and scanning the array to expose a desired pattern of the target positions on the object, for each of the plural columns of each of the plural and successive respective stages of plural columns of blanking apertures in each of the successive steps and for each of the first and successive respective alignment rows of blanking apertures and target positions of the plural sets thereof in each of the respective, successive substeps of each successive step.

32. A charge particle beam exposure system for producing a pattern on a surface of an object, comprising:

charge particle beam generating beams for generating a charge particle beam;

blanking aperture array means, having a plurality of selectively and individually controllable blanking apertures arranged in a two-dimensional configuration of parallel rows and transverse, parallel columns to form a blanking aperture array, for shaping the charge particle beam generated by the charge particle beam generating means;

scanning means for repeatedly scanning the blanking aperture array means with the beam and for selectively controlling and thereby enabling the individual apertures thereof thereby to permit the scanning beam to pass through the individual, selectively enabled apertures of the array;

holding means for holding an object to be exposed;

deflecting means for deflecting the scanning beam, after passing through a selectively enable aperture of the blanking aperture array means to scan the object in a corresponding position thereon;

means for defining potential target positions to be exposed on the object, the target positions are arranged in a two dimensional configuration of parallel rows and transverse, parallel columns corresponding to the two-dimensional configuration of the blanking apertures of the blanking aperture array means;

means for moving the object, as held by the holding means, relative to the blanking aperture array means and in a first direction parallel to the respective columns of the blanking aperture array and of the target positions and for performing:

a first step of scanning the blanking aperture array to expose a desired pattern of first target positions in a first row on the object with the beam in accordance with selectively enabling the corresponding apertures of the first row of apertures of the blanking aperture array means, and a second step of moving the object relative to the blanking aperture array means in the first direction so as to position the first potential target positions on the object in correspondence with a second, next excessive row of apertures of the array and thereby to position a second row of potential target positions on the object with the first row of apertures of the array and selectively and individually enabling the blanking apertures of the second row of the blanking aperture array in accordance with the desired pattern of the first target positions of the first row of the object and, simultaneously, selectively and individually enabling the apertures of the first row of the array in accordance with a desired pattern of second target position in a second row on the object, and scanning the blanking aperture array with the beam so as to expose the desired pattern of first target positions in the first row and the second target positions in the second row of the object with the beam, in accordance with the selectively enabled and corresponding apertures of the respective, second and first rows of apertures of the blanking aperture array.

33. An apparatus for exposing an object by a charged particle beam exposure system having means for generating a charge particle beam, a blanking aperture array comprising a plurality of selectively and individually controllable blanking apertures arranged in a two-dimensional configuration of parallel rows and transverse, parallel columns, and means for repeatedly scanning the blanking aperture array with the beam and for selectively controlling and thereby enabling the individual apertures thereof thereby to permit the scanning beam to pass through the individual, selectively enabled apertures of the array, means for holding an object to be exposed and deflecting means for deflecting the beam, after passing through a selectively enabled aperture of the array, to scan the object in a corresponding target position thereon, said method comprising:

means for defining the respective positions of the blanking apertures within the blanking aperture array and in accordance with two-dimensional configuration of parallel rows and transverse, parallel columns, the columns being grouped in parallel stages and each stage comprising a set of a common number of plural columns including a first and successive columns, the respectively corresponding apertures of the set of successive columns of each of the plurality of stages being successively spaced and off-set in the column direction and the respective blanking apertures of the respective, first and successive columns of sets thereof, of the plural stages, being aligned in respective rows of a row alignment pattern, the row alignment pattern thereby including plural sets, each set comprising a number of first and successive alignment rows equal to the common number of the columns of apertures in each of the plural stages;

means for defining potential target positions to be exposed on the object, the target positions being arranged in a two-dimensional configuration of parallel rows and transverse, parallel columns corresponding to the two-dimensional configuration of the array and including plural, adjacent target positions in each of the plural columns arranged in respectively corresponding target position rows and grouped in sets of, each of plural rows, the plural sets of target position rows respectively corresponding the plural sets of blanking aperture alignment rows and the first and successive target position rows of each set respectively corresponding to the first and successive alignment rows of the array; and means for moving the object relative to the blanking aperture array in a succession of steps, each step including a set of plural substeps comprising a first and successive substeps equal in number to the number of first and successive columns in each stage of plural columns of the blanking aperture array and thereby in a first step and associated first substep, scanning the blanking aperture array to expose a desired pattern of first target positions in the corresponding first row alignment position of the plural sets thereof and in a first column of target positions on the object with the beam, in accordance with selectively enabling the corresponding apertures of the first alignment row of apertures of the first column thereof, of the blanking aperture array and for moving:

in a second substep of the first step, the object relative to the array in the first direction in so as to position the second alignment row of each of the plural sets thereof of potential target group positions of the first column on the object with the target column of potential target positions respectively of the second alignment rows of the sets of the array, and selectively individually enabling the aligned blanking apertures of the array in accordance with the desired pattern of the first target positions of the first row of the object, and repeating the second substeps for each of the successive columns and alignment rows of the first stage of the array, and in each of second and successive steps and, for each step, in each of the associated first and successive steps, moving the object relative to the array in the first direction and scanning the array to expose a desired pattern of the target positions on the object, for each of the plural columns of each of the plural and successive respective stages of plural columns of blanking apertures in each of the successive steps and for each of the first and successive respective alignment rows of blanking apertures and target positions of the plural sets thereof in each of the respective successive substeps of each successive step.

* * * * *

UNITED STATES PATENT AND TRADEMARK OFFICE
CERTIFICATE OF CORRECTION

PATENT NO. : 5,260,579
DATED : November 9, 1993
INVENTOR(S) : Hiroshi YASUDA et al.

It is certified that error appears in the above-indentified patent and that said Letters Patent is hereby corrected as shown below:

Column 1, line 34, delete "35".

Column 2, lines 33, 46 and 50, change "into" to --to--.

Column 3, line 34, change "focusing" to --focusing,--.

Column 4, line 63, change "Therefore" to --Therefore,--.

Column 5, line 1, change "addition" to --addition,--.

Column 7, line 29, change ";" to --.--;

line 38, change "thereby" to --thereby,--.

UNITED STATES PATENT AND TRADEMARK OFFICE
CERTIFICATE OF CORRECTION

PATENT NO. : 5,260,579
DATED : November 9, 1993
INVENTOR(S) : Hiroshi YASUDA et al.

It is certified that error appears in the above-indentified patent and that said Letters Patent is hereby corrected as shown below:

Column 8, line 22, change "beam" to --beams--.

Column 10, line 41, change "(-C)" to --(A-C)--.

Column 11, line 27, change "numerals" to

--numeral--;

line 65, change "," (2nd occurrence) to --;--.

Column 14, line 3, change "a" to --$\underline{a}$--;

line 7, change "b" to --$\underline{b}$--;

line 9, change "c" to --$\underline{c}$--.

Column 17, line 23, change "$1_1$" to --$\ell_1$";

line 25, change "$1_2$, $1_3$ and $1_4$"

to --$\ell_2$, $\ell_3$ and $\ell_4$--.

Column 18, line 24, change "$A_2$" to --$A_2$,--.

UNITED STATES PATENT AND TRADEMARK OFFICE
CERTIFICATE OF CORRECTION

PATENT NO. : 5,260,579
DATED : November 9, 1993
INVENTOR(S) : Hiroshi YASUDA et al.

It is certified that error appears in the above-indentified patent and that said Letters Patent is hereby corrected as shown below:

Column 19, line 13, change "T1" to --T1,--.

Column 22, line 3, change "3" to --3,--.

Column 23, line 19, change "5/8" to --1/8--.

Column 26, line 24, delete ",".

Column 27, line 68, delete ".".

Column 30, line 30, change "irrigate" to --irradiate--.

Column 30, line 68, change "position" to --positions--.

Signed and Sealed this

Third Day of January, 1995

BRUCE LEHMAN

*Attest:*

*Attesting Officer*   Commissioner of Patents and Trademarks